(12) United States Patent
Wei

(10) Patent No.: US 12,426,253 B2
(45) Date of Patent: Sep. 23, 2025

(54) DYNAMIC RANDOM ACCESS MEMORY STRUCTURE AND A METHOD FOR FORMING THE SAME

(71) Applicant: Winbond Electronics Corp., Taichung (TW)

(72) Inventor: Hung-Yu Wei, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 335 days.

(21) Appl. No.: 18/072,348

(22) Filed: Nov. 30, 2022

(65) Prior Publication Data

US 2024/0179891 A1  May 30, 2024

(51) Int. Cl.
H10B 12/00 (2023.01)

(52) U.S. Cl.
CPC .......... *H10B 12/34* (2023.02); *H10B 12/053* (2023.02); *H10B 12/315* (2023.02); *H10B 12/482* (2023.02)

(58) Field of Classification Search
CPC .... H10B 12/053; H10B 12/315; H10B 12/34; H10B 12/482; H10B 12/488; H01L 29/42356
USPC ........................................................ 257/330
See application file for complete search history.

(56) References Cited

U.S. PATENT DOCUMENTS

| | | | |
|---|---|---|---|
| 10,199,379 B2 | 2/2019 | Cho et al. | |
| 10,896,966 B2 | 1/2021 | Lee et al. | |
| 2016/0308000 A1 | 10/2016 | Kim et al. | |
| 2021/0013214 A1 | 1/2021 | Terada | |
| 2021/0066466 A1* | 3/2021 | Kwon | H10D 64/687 |
| 2022/0077154 A1* | 3/2022 | Kim | H10B 12/315 |
| 2023/0043936 A1* | 2/2023 | Park | H01L 21/76283 |

FOREIGN PATENT DOCUMENTS

TW    I753736 B    1/2022

* cited by examiner

*Primary Examiner* — Hoai V Pham
(74) *Attorney, Agent, or Firm* — MUNCY, GEISSLER, OLDS & LOWE, P.C.

(57) ABSTRACT

A semiconductor structure is provided. The semiconductor structure includes a substrate, an isolation feature, a word line and a doped region. The substrate has an active region. The isolation feature is disposed in the substrate to define the active region. The word line is buried in the substrate and extends across the active region and the isolation feature. The word line includes a first conductive structure and a second conductive structure disposed on the first conductive structure. The doped region is disposed in the active region and adjacent to the word line, wherein a top surface of the first conductive structure is below a bottom surface of the doped region.

17 Claims, 24 Drawing Sheets

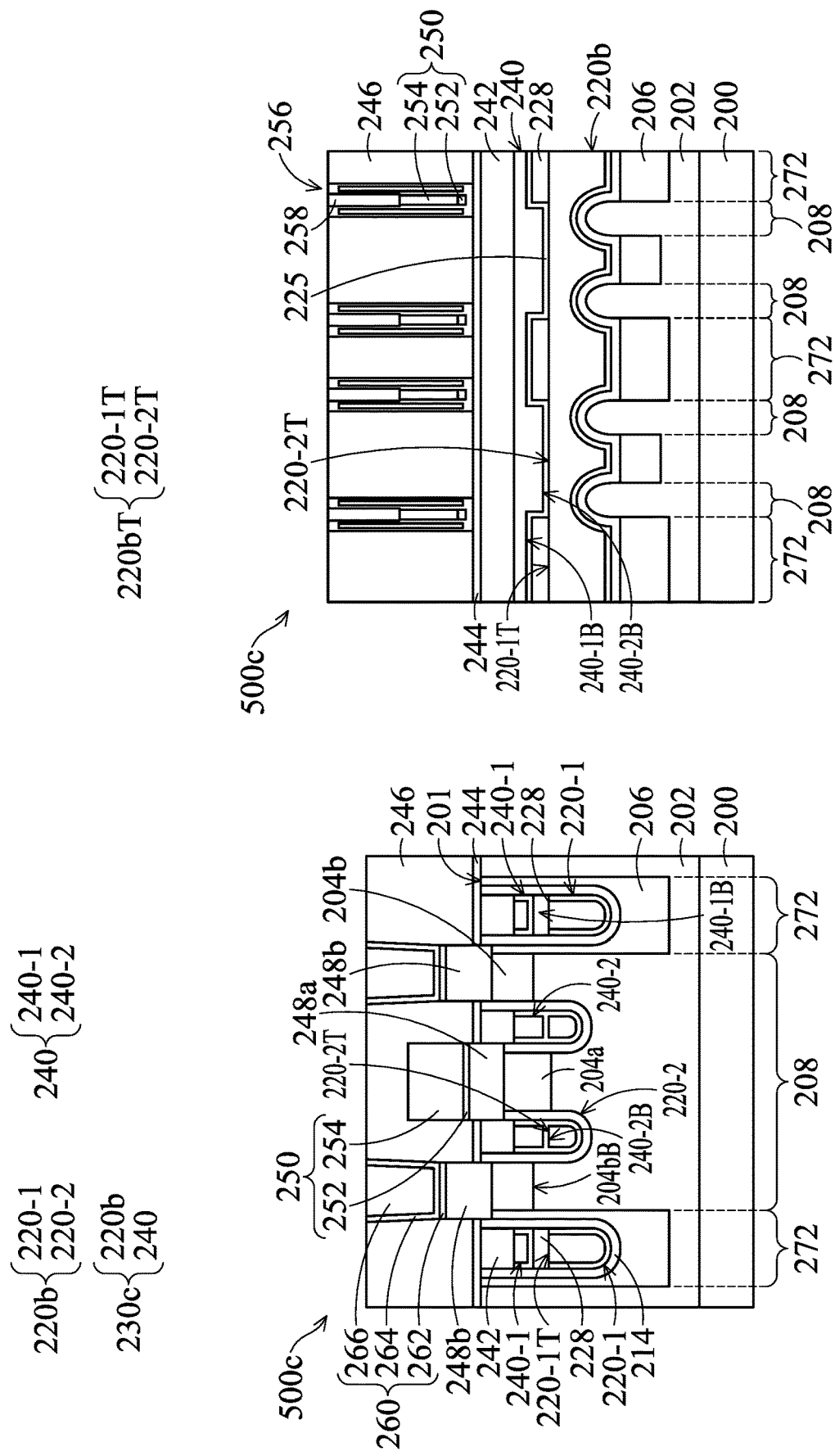

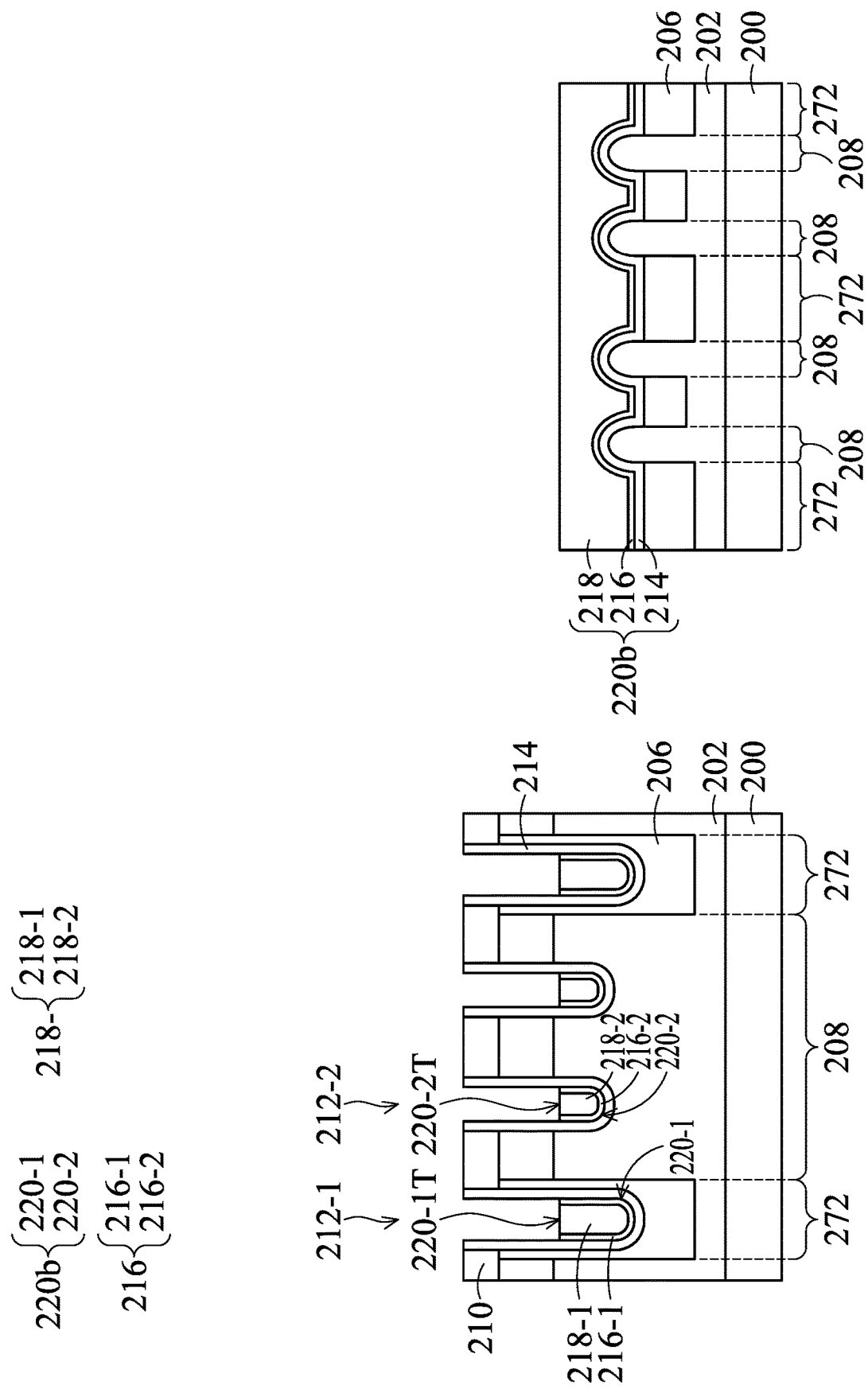

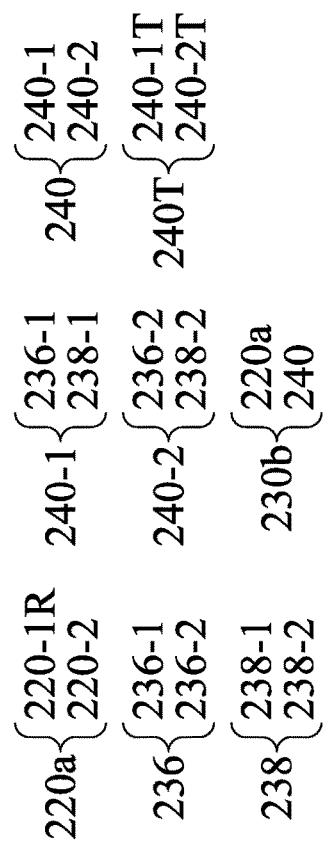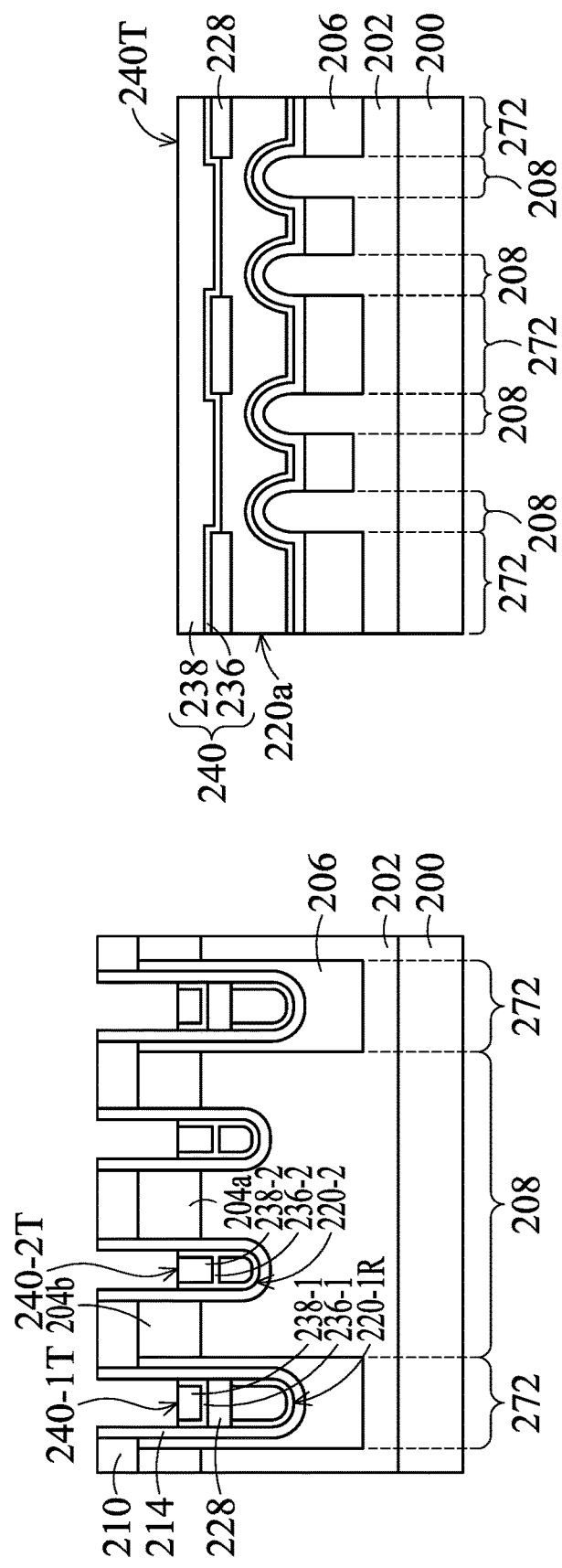
FIG. 11B
FIG. 11C

DYNAMIC RANDOM ACCESS MEMORY STRUCTURE AND A METHOD FOR FORMING THE SAME

BACKGROUND OF THE INVENTION

Field of the Invention

The present invention relates to a semiconductor structure and a method for forming the same, and in particular it relates to a dynamic random access memory structure and a method for forming the same.

Description of the Related Art

Dynamic Random Access Memory (DRAM) devices are widely used in consumer electronic products. In order to increase element density in a DRAM device and improve its overall performance, existing technologies for fabricating DRAM devices continue to focus on scaling down the size of the elements.

However, as element density continues to increase, the challenges also increase. For example, issues such as gate induced drain leakage (GIDL), row hammer, and refresh time (tRef) performance need to be addressed.

BRIEF SUMMARY OF THE INVENTION

Embodiments of the disclosure provide a semiconductor structure which includes a substrate, an isolation feature, a word line and a doped region. The substrate has an active region. The isolation feature is disposed in the substrate to define the active region. The word line is buried in the substrate and extends across the active region and the isolation feature. The word line includes a first conductive structure and a second conductive structure disposed on the first conductive structure. The doped region is disposed in the active region and adjacent to the word line, wherein a top surface of the first conductive structure is below a bottom surface of the doped region.

Embodiments of the disclosure provide a method for forming a semiconductor structure includes: providing a substrate; forming a doped region in the substrate; forming an isolation feature in the substrate to define an active region; and forming a word line in the substrate, extending across the active region and the isolation feature and adjacent to the doped region, wherein the word line includes a first conductive structure and a second conductive structure disposed on the first conductive structure, wherein a top surface of the first conductive structure is below a bottom surface of the doped region.

BRIEF DESCRIPTION OF THE DRAWINGS

FIGS. 2A, 3A and 4A are schematic cross-sectional views along the line A-A' of the semiconductor structure shown in FIG. 1 in accordance with some embodiments of the disclosure;

FIGS. 2B, 3B and 4B are schematic cross-sectional views along the line B-B' of the semiconductor structure shown in FIG. 1 in accordance with some embodiments of the disclosure;

FIGS. 5B, 6B, 7B, and 8B are schematic cross-sectional views taken along the line A-A' of FIGS. 5A, 6A, 7A, and 8A, respectively, showing schematic cross-sectional views of intermediate stages of forming a semiconductor structure in accordance with some embodiments of the disclosure;

FIGS. 5C, 6C, 7C, and 8C are schematic cross-sectional views taken along the line B-B' of FIGS. 5A, 6A, 7A, and 8A, respectively, showing schematic cross-sectional views of intermediate stages of forming a semiconductor structure in accordance with some embodiments of the disclosure;

FIGS. 9B, 10B, 11B, and 12B are schematic cross-sectional views taken along the line A-A' of FIGS. 9A, 10A, 11A, and 12A, respectively, showing schematic cross-sectional views of intermediate stages of forming a semiconductor structure in accordance with some embodiments of the disclosure;

FIGS. 9C, 10C, 11C and 12C are schematic cross-sectional views taken along line B-B' of FIGS. 9A, 10A, 11A and 12A, respectively, showing schematic cross-sectional views of intermediate stages of forming a semiconductor structure in accordance with some embodiments of the disclosure;

DETAILED DESCRIPTION OF THE INVENTION

In the conventional dynamic random access memory (DRAM), when the applied voltages are switched sequentially on adjacent word lines to write data, the selected word line (connecting to the target bit) is driven to a high voltage, and the adjacent, non-selected word lines still have the transient voltage when switching to a low voltage, so the portion of the selected word line in the shallow trench isolation (STI) feature that crosses and cuts off the active region (also known as the passing word line (PWL)) will form a channel from the doped region to the underlying substrate along the vertical sidewalls of the isolation feature, thereby causing leakage. In addition, the overlapping region of the doped region and the adjacent passing word line (gate) will generate an electric field due to the voltage difference and form a depletion region, resulting in gate induced drain leakage (GIDL). Furthermore, the depletion region touching the silicon lattice defects in the substrate close to the edge of the isolation feature will result in the junction leakage from the doped region to the underlying substrate. The leakages will become serious due to the continuous switching the applied voltage to the word lines (also known as the word line disturbing), and will cause the row hammer issue, which will damage the data stored in the bits connected to the adjacent rows (word lines) (such as the bit flips from "0" to "1"), worsen the refresh time (tRef) performance and cause a reduced reliability of the device. Therefore, there is a need for a semiconductor structure and a method of fabricating the same to overcome the aforementioned problems.

Figure 1:
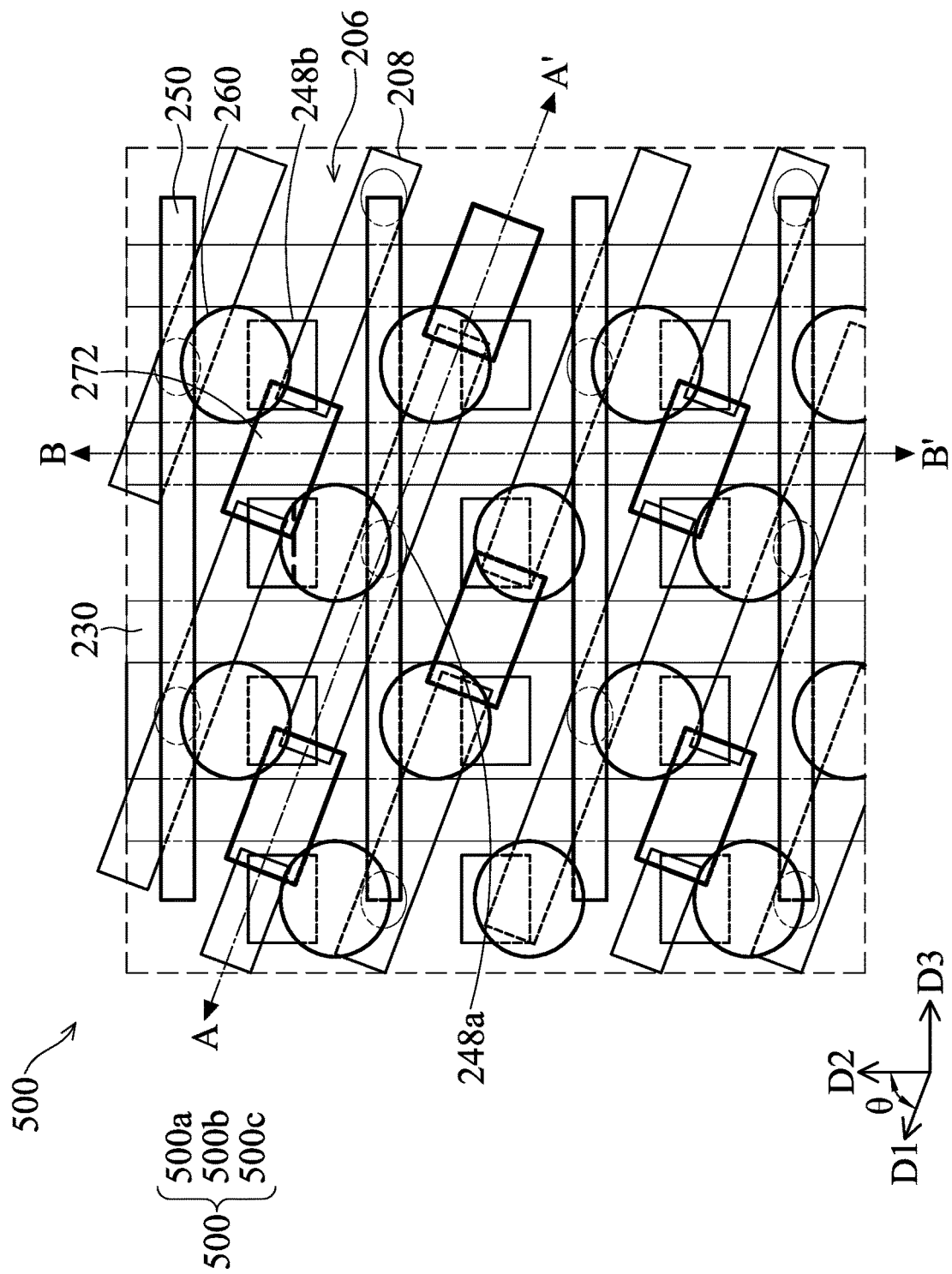
FIG. 1 is a schematic top view of a semiconductor structure in accordance with some embodiments of the disclosure.

FIG. 1 is a schematic top view of a semiconductor structure 500 in accordance with some embodiments of the disclosure. The semiconductor structure 500 includes semiconductor structures 500a, 500b, and 500c shown in FIGS. 2A, 2B, 3A, 3B, 4A, and 4B. For illustration of the reference directions labeled in the figures, a direction D1 is defined as the channel extending direction, the direction D2 is defined as the gate extending direction (or the word line extending direction), and the direction D3 is defined as the bit line extending direction. The direction D2 is substantially perpendicular to the direction D3. The direction D1 and the direction D2 intersect at an acute angle θ.

Figures 2A, 2B:
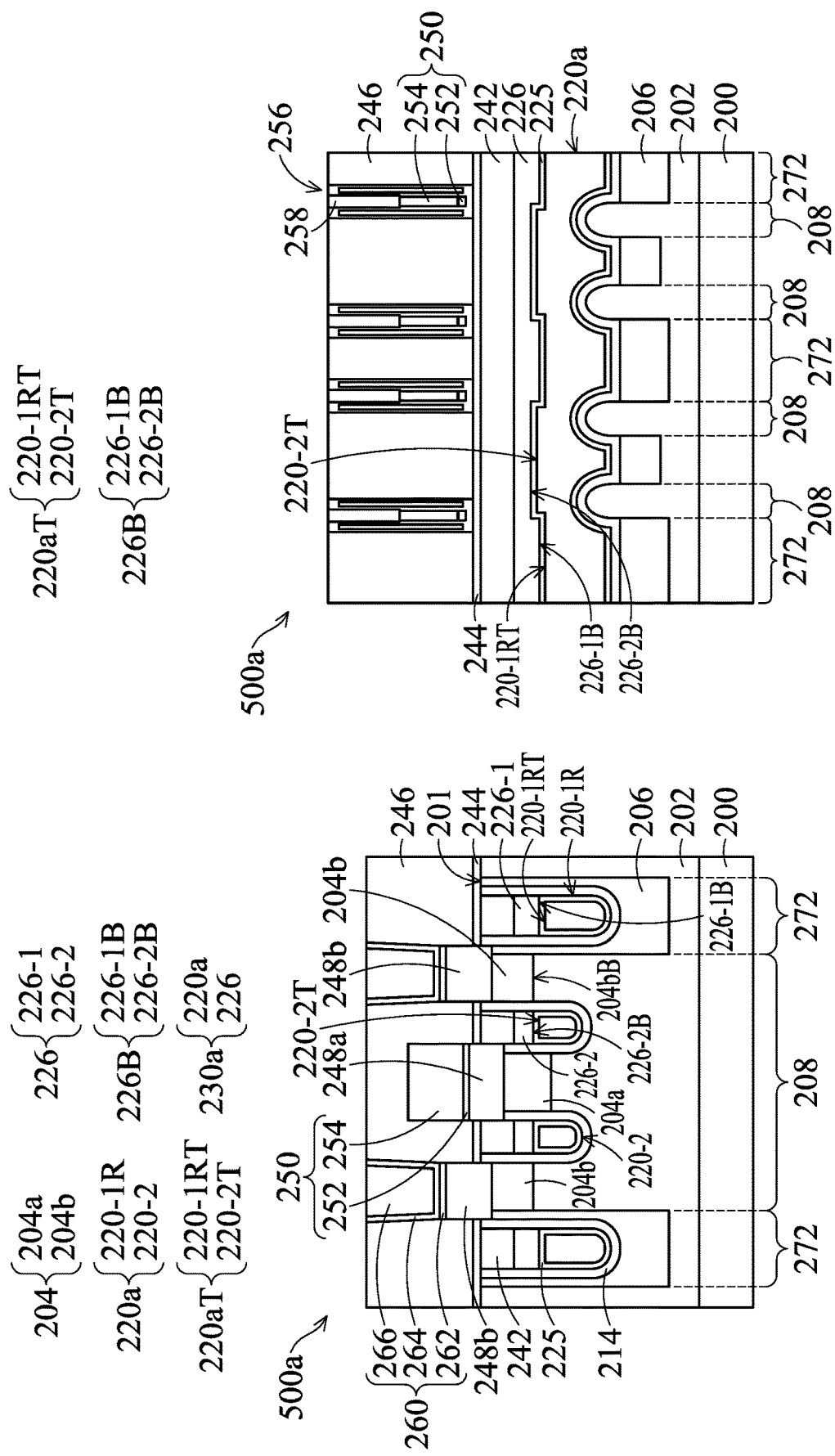
Figures 3A, 3B:
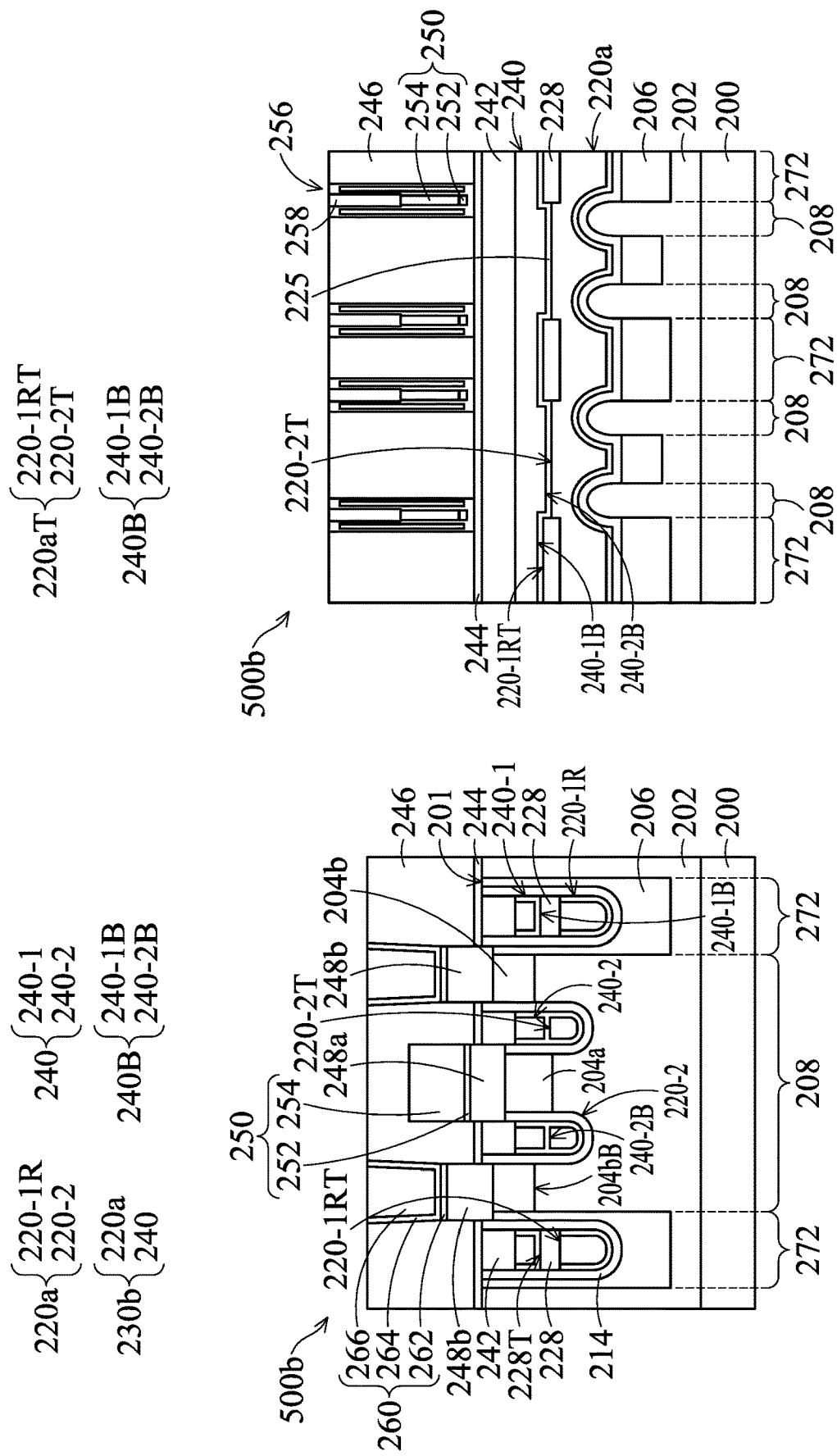

As shown in FIG. 1, a semiconductor structure 500 is provided. In some embodiments, the semiconductor structure 500 is a portion of a dynamic random access memory (DRAM). The semiconductor structure 500 includes an isolation feature 206, an active region 208, a word line 230, contact plugs 248a, 248b, a bit line 250, and a storage capacitor 260. FIG. 1 only shows some of the features for illustration, and FIGS. 2A, 3A, and 4A are taken along the line A-A' of FIG. 1, which is substantially parallel to the direction D1. FIGS. 2B, 3B, and 4B are taken along line B-B' of FIG. 1, which is substantially parallel to the direction D2.

The isolation feature 206 is formed in the substrate to define a plurality of active regions 208 in the substrate. The active regions 208 extend along direction D1 and are spaced apart along direction D1 and direction D2, respectively. The adjacent active regions 208 on the same line along the direction D1 completely overlap each other and are separated from each other by the isolation feature 206 of the cut-off region 272. In the direction D2, the adjacent cut-off regions 272 are misaligned or non-overlapping. The adjacent active regions 208 on the same line along the direction D2 partially overlap each other and are separated from each other by the isolation feature 206. In some embodiments, the size of the memory cells of semiconductor structure 500 is 6F² (3F in length, 2F in width, F being the minimum feature size).

The word lines 230 are formed in the substrate and extend along the direction D2. In the direction D3, the word lines 230 are arranged in a way of a pair of the adjacent word lines 230 corresponds to one active region 208. The bit lines 250 are formed over the substrate and extend along the direction D3. The bit lines 250 are arranged corresponding to active regions 208 in the direction D2. The storage capacitors 260 are formed over the substrate and are located in regions between an adjacent pair of the word lines 230 and an adjacent pair of the bit lines 250.

The contact plugs 248a are located at the intersections of the bit lines 250 and the active regions 208. When the bit line 250 is formed crossing the pair of the word lines 230 corresponding to the active region 208, the bit line 250 is electrically connected to a block of the active region 208 between the pair of word lines 230 through the contact plug 248a. The contact plugs 248b are located between an adjacent pair of the word lines 230 and an adjacent pair of the bit lines 250 and partially overlap the corresponding active regions 208. The storage capacitors 260 are electrically connected to end portions of the corresponding active regions 208 through the contact plugs 248b.

Referring to FIGS. 2A, 2B, the semiconductor structure 500a includes a substrate 200, the isolation feature 206, the word line 230a and doped regions 204.

As shown in FIGS. 1, 2A, and 2B, the isolation feature 206 is disposed in the substrate 200 to define the active region 208 of the substrate 200. The isolation feature 206 may be shallow trench isolations and formed of, for example, silicon oxide (SiO), silicon nitride (SiN), silicon oxynitride (SiON), and/or a combination thereof. In some embodiments, the isolation feature 206 is formed using a patterning process followed by deposition and planarization processes.

The word line 230a is buried in the substrate 200 and extends across the active region 208 and the isolation feature 206. In some embodiments, the word line 230a includes a first conductive structure 220a and a second conductive structure 226 disposed on the first conductive structure 220a. The word line 230a further includes a liner 225 disposed between the first conductive structure 220a and the second conductive structure 226. In some embodiments, a first portion 220-1R of the word line 230a may serve as a passing word line (PWL) located in the cut-off region 272 of the isolation feature 206. A second portion 220-2 of the word line 230a may serve as an active word line located in the active region 208.

In the cut-off region 272 of the isolation feature 206, a top surface 220-1RT of the first portion 220-1R of the first conductive structure 220a is below a bottom surface 204bB of the doped region 204b. In some embodiments, the top surface 220-1RT of the first portion 220-1R of the first conductive structure 220a in the cut-off region 272 is located below a top surface 220-2T of the second portion 220-2 of the first conductive structure 220a in the active region 208. In other words, a bottom surface 226-1B of a first portion 226-1 of the second conductive structure 226 in the cut-off region 272 is located below a bottom surface 226-2B of a second portion 226-2 of the second conductive structure 226 in the active region 208. As shown in FIG. 2B, a top surface 220aT of the first conductive structure 220a and a bottom surface 226B of the second conductive structure 226 are jagged in the cross-sectional view along the direction D2.

Figure 5A:
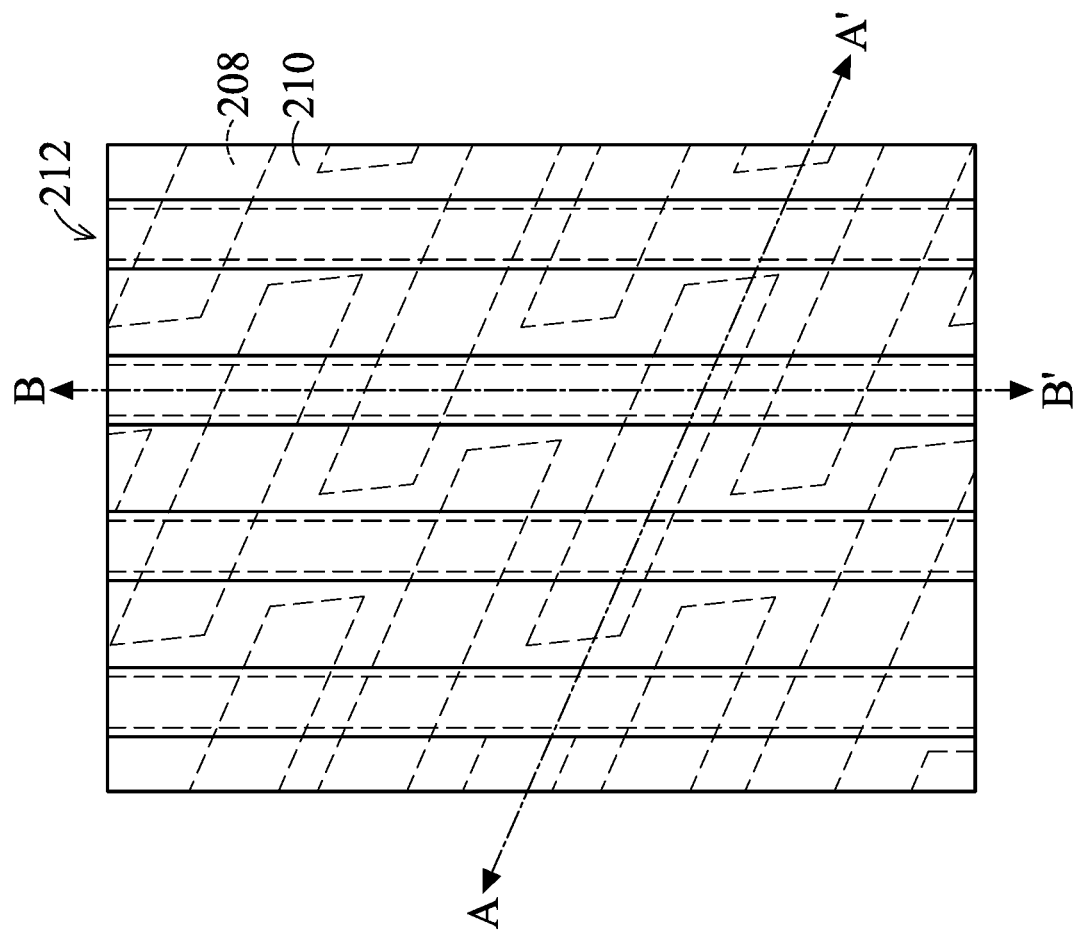
FIGS. 5A, 6A, 7A, and 8A are schematic top views of intermediate stages of forming a semiconductor structure in accordance with some embodiments of the disclosure.
Figure 5C:
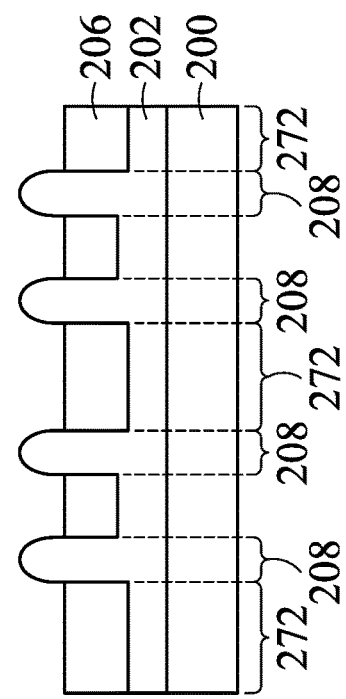
Figure 5B:
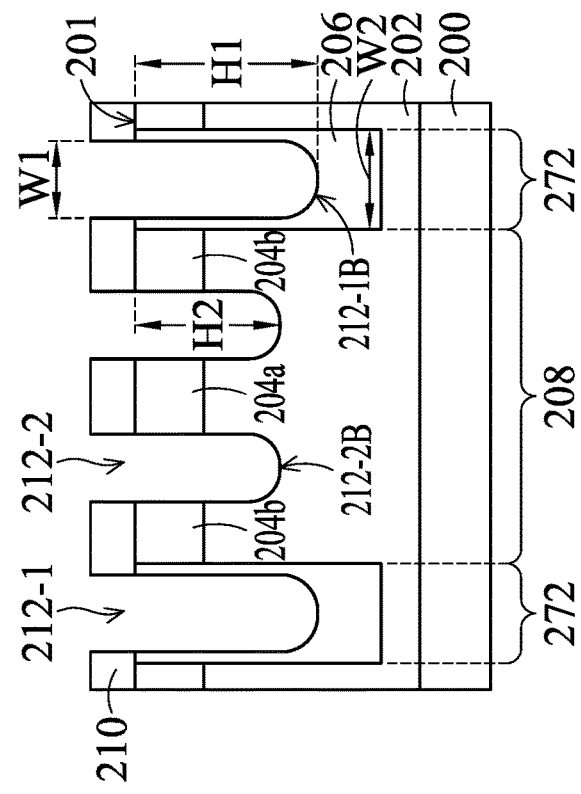

In some embodiments, the first conductive structures 220a and the second conductive structures 226 are made of different materials and have different structures. In some embodiments, a work function of the second conductive structure 226 is less than a work function of the first conductive structure 220a and greater than a work function of the substrate 200 (e.g., the work function of the substrate 200 of silicon is about 3.9). For example, the first conductive structure 220a may include a liner 216R and a gate electrode 218R (as shown in FIGS. 7B and 7C). The liner 216R conformally covers a trench 212 of the word line in the substrate 200 (as shown in FIGS. 5A, 5B, 5C). In addition, the gate electrode 218R is disposed on the liner 216R and partially filled the trench 212. In some embodiments, the liner 216R includes tungsten nitride (WN) (the work function is about 4.6), titanium nitride (TiN) (the work function is about 4.7), or tantalum nitride (TaN) (the work function is about 4.5). The gate electrode 218R includes a metal such as tungsten (W) (the work function is about 4.52). In some embodiments, the liner 225 is formed to cover the first conductive structure 220a. The materials and the forming method of the liner 225 may be similar to those of the liner 216R. In some embodiments, the second conductive structure 226 may be a single-layer structure, which may include doped polysilicon, such as N-type doped polysilicon (the work function is about 4.05). The liner 216R, the gate electrode 218R, and the second conductive structure 226 may be individually formed by chemical vapor deposition (CVD), physical vapor deposition (PVD), or atomic layer deposition (ALD).

As shown in FIGS. 1 and 2A, the doped region 204 includes a doped region (a source doped region) 204a and a doped region (a drain doped region) 204b, which are disposed in the active region 208 and adjacent the word line 230a.

As shown in FIGS. 2A and 2B, the semiconductor structure 500a further includes a gate dielectric layer 214 on the surface of the trench 212 (as shown in FIG. 5B). The gate dielectric layer 214 is formed of, for example, silicon oxide, silicon nitride, silicon oxynitride and/or a high dielectric constant (k) dielectric material. In some embodiments, the gate dielectric layer 214 is formed using in-situ steam generation (ISSG), chemical vapor deposition (CVD), or atomic layer deposition (ALD).

The semiconductor structure 500a further includes a capping layer 242 disposed on the word line 230a and filling the upper portion of the trench 212 (as shown in FIG. 5B). The capping layer 242 may be formed of a dielectric material such as silicon nitride or silicon oxide.

The semiconductor structure 500a further includes a capping layer 244 formed on a top surface 201 of the substrate 200 and covering the word lines 230a. In some embodiments, the capping layer 244 is formed of an oxide, such as silicon oxide.

The semiconductor structure 500a further includes an interlayer dielectric (ILD) layer 246 disposed on the substrate 200. The interlayer dielectric layer 246 includes, for example, silicon oxide, silicon nitride, silicon oxynitride, phosphosilicate glass (PSG), borophosphosilicate glass (BPSG), other suitable low-k dielectric materials, or a combination thereof. In this embodiment, the interlayer dielectric layer 246 includes silicon nitride. In some embodiments, the interlayer dielectric layer 246 is formed, for example, by chemical vapor deposition (CVD), flowable chemical vapor deposition (FCVD), spin-on-glass (SOG), other suitable methods, or a combination thereof.

The contact plugs 248a and 248b of the semiconductor structure 500a are disposed on the substrate 200, pass through the interlayer dielectric layer 246 and the capping layer 244. The contact plugs 248a and 248b are electrically connected to the doped regions 204a and 204b, respectively. In some embodiments, the contact plugs 248a, 248b are formed of a conductive material.

As shown in FIGS. 1 and 2A, the bit line 250 is formed over the substrate 200 and in the interlayer dielectric layer 246. In addition, the bit line 250 is disposed on the contact plug 248a and is electrically connected to the doped region 204a through the contact plug 248a. In some embodiments, the bit line 250 includes a barrier layer 252 formed on the contact plug 248a and a conductive layer 254 formed on the barrier layer 252. In some embodiments, the barrier layer 252 is formed of titanium (Ti), tantalum (Ta), titanium nitride (TiN), and/or tantalum nitride (TaN). The conductive layer 254 is formed of tungsten (W), aluminum (Al), and/or copper (Cu).

As shown in FIGS. 1 and 2B, the semiconductor structure 500a further includes a sidewall layer 256 disposed on the sidewall of the bit line 250, and a capping layer 258 disposed on the bit line 250 and between the sidewall layers 256. In some embodiments, the sidewall layer 256 is a composite layer formed by sandwiching a silicon oxide layer between two silicon nitride layers. In addition, the capping layer 258 includes silicon nitride.

The storage capacitor 260 is disposed above the substrate 200 and the contact plug 248b, and is electrically connected to the doped region 204b through the contact plug 248b. In some embodiments, the storage capacitor 260 includes a first electrode 262, a dielectric 264 and a second electrode 266 formed on the contact plug 248b in sequence. The first electrode 262 and the second electrode 266 may include a conductive material, and the dielectric 264 may include a high-k dielectric material.

In some embodiments, the top surface 220aT of the first conductive structure 220a in the isolation feature 206 is below the bottom surface 204bB of the drain doped region 204b. The work function of the second conductive structure 226 is less than that of the first conductive structure 220a, so that the electric field generated in the overlapping region of the second conductive structure 226 with the lower work function and the drain doped region 204b can be reduced. The GIDL can be further reduced. In addition, the channel leakage and the junction leakage from the drain doped region 204b to the underlying semiconductor substrate 200 can be reduced. Therefore, the row hammer effect can be improved, the performance of the refresh time (tRef) can be improved, and the reliability of the semiconductor structure can be increased.

Referring to FIGS. 3A and 3B, which show a semiconductor structure 500b in accordance with some embodiments of the disclosure, in which the reference numbers the same or similar to those in FIGS. 1, 2A, and 2B denote the same or similar elements.

Unlike the semiconductor structure 500a, the semiconductor structure 500b further includes a dielectric feature 228 disposed in the isolation feature 206 and between the first conductive structure 220a and a second conductive structure 240 of the word line 230b.

Figure 11A:
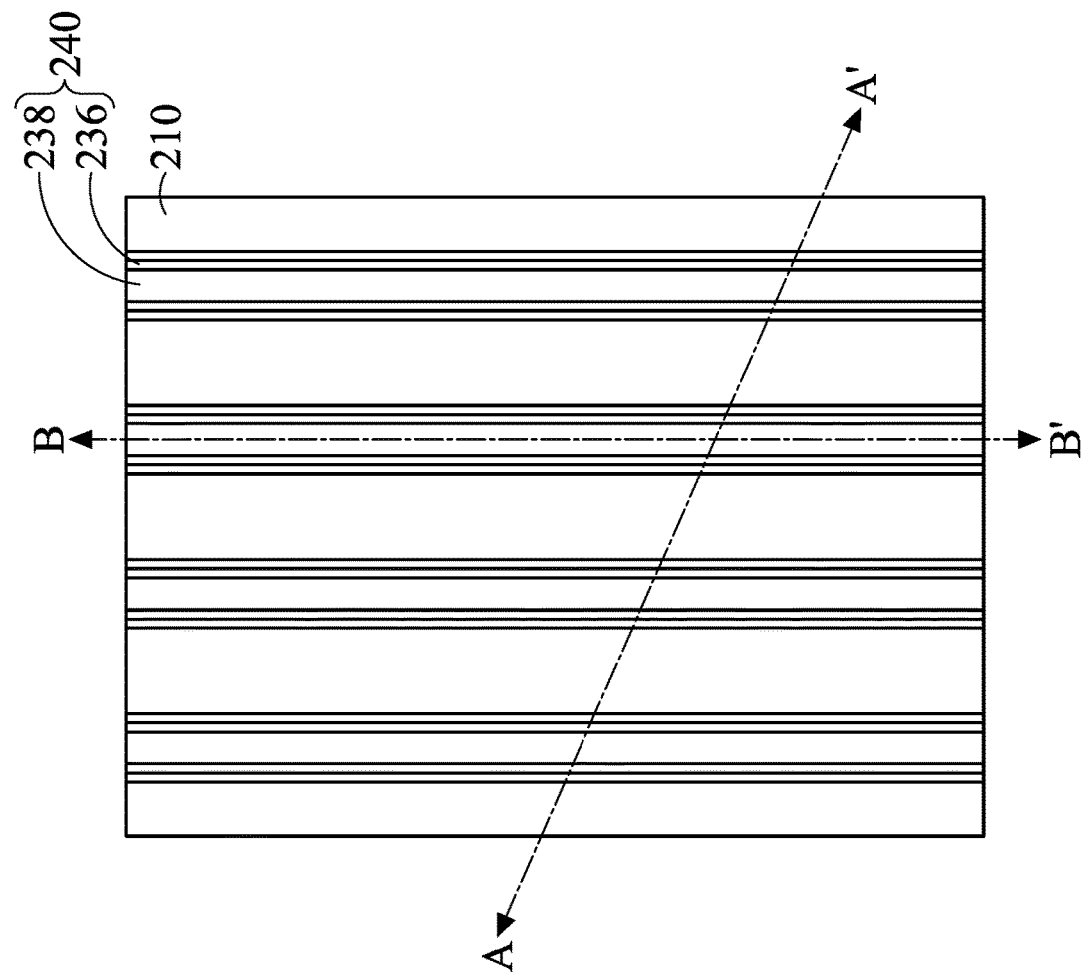

In the word line 230b in the isolation feature 206, a first portion 240-1, which serves as the second conductive structure 240, is separated from the first portion 220-1R, which serves the first conductive structure 220a, by the dielectric feature 228. In one embodiment, the top surface 220-1RT of the first portion 220-1R of the first conductive structure 220a is below the bottom surface 204bB of the doped region 204b. In the word line 230b in the active region 208, a second portion 240-2, which serves as the second conductive structure 240, is in contact with the second portion 220-2, which serves as the first conductive structure 220a. In some embodiments, the second conductive structure 240 of the word line 230b includes a liner 236 and a gate electrode 238 (as shown in FIGS. 11A, 11B and 11C). The liner 236 covers the trench 212 in the substrate 200 (as shown in FIGS. 5A and 5B), and the gate electrode 238 is disposed on the liner 236 and partially fills the trench 212. As shown in FIG. 3B, a bottom surface 240B of the second conductive structure 240 is jagged in the cross-sectional view along the direction D2. In some embodiments, liner 236 and liner 216R comprise the same or similar materials and processes. In some embodiments, the gate electrode 238 and the gate electrode 218R comprise the same or similar materials and processes. In some embodiments, the second conductive structure 240 of the word line 230b may also include the gate electrode 238 only.

In some embodiments, a top surface 228T of dielectric feature 228 is above the bottom surface 204bB of doped region 204b. In some embodiments, the top surface 228T and a bottom surface 228B of dielectric feature 228 are below bottom surface 204bB of doped region 204b. In some embodiments, the top surface 228T of the dielectric feature 228 of the word line 230b in the cut-off region 272 is higher than the top surface 220-2T of the first conductive structure 220a (the second portion 220-2) of the word line 230b in the active region 208. In some embodiments, the dielectric features 228 include silicon oxide, silicon nitride, silicon oxynitride, and/or a combination thereof.

Referring to FIGS. 4A and 4B, which show a semiconductor structure 500c in accordance with some embodiments of the disclosure, in which the reference numbers the same or similar to those in FIGS. 1, 2A, 2B, 3A, and 3B denote the same or similar elements.

Unlike the semiconductor structure 500b, in the semiconductor structure 500c, a top surface 220-1T of a first conductive structure 220b (the first portion 220-1) of a word line 230c in the isolation feature 206 is level with the top surface 220-2T of the first conductive structure 220b (the second portion 220-2) of the word line 230c in the active region 208. As shown in FIG. 4B, a top surface 220bT of the first conductive structure 220b of the word line 230c is a planar surface in the cross-sectional view along the direction D2. The structures, materials and formation methods of the remaining portions of the semiconductor structure 500c are similar to those of the semiconductor structure 500b, and are not repeated herein.

In some embodiments, in the word lines 230b and 230c of the semiconductor structures 500b and 500c, the first conductive structures 220a and 220b and the second conductive structures 240 may have the same structure and material. When the voltage levels are switched on adjacent word lines, the dielectric feature 228 can cut off the channel region and the depletion region formed along the vertical sidewalls of the isolation feature 206 between the passing word line (the first portions 220-1R and 220-1 of the first conductive structures 220a and 220b) and the adjacent doped region 204b by reversed biasing the carriers. Therefore, the channel leakage and junction leakage generated from the drain doped region 204b to the underlying semiconductor substrate 200 can be suppressed. The dielectric feature 228 can reduce the electric field in the overlapping region of the first conductive structures 220a, 220b and the drain doped region 204b, thereby reducing the GIDL. In addition, the first conductive structures 220a, 220b and the second conductive structures 240 having the same structure and material can maintain the writing/reading speed of the word lines 230b, 230c. Therefore, the row hammer effect can be improved, the refresh time performance can be improved, and the reliability of the semiconductor structure element can be increased.

The methods for forming the semiconductor structures 500a, 500b, and 500c will be described below, respectively.

Referring to FIGS. 5A, 5B, and 5C, a substrate 200 is provided. Next, ion implantation processes are performed to implant a dopant of a first conductivity type into the substrate 200 to form a well region 202, and implant a dopant of a second conductivity type opposite to the first conductivity type into the substrate 200, to form a doped region 204 on the well region 202.

Next, a patterning process is performed to form trenches (not shown) in the substrate 200 to define the formation positions of the isolation features 206. Next, a deposition process is performed to deposit a dielectric material in the trenches, and then a planarization process is performed to form the isolation features 206 in the substrate 200. The isolation features 206 extend downwardly from the top surface 201 of the substrate 200 to define the active regions 208 of the substrate 200, wherein bottom surfaces of the isolation features 206 are within the well region 202.

Next, a deposition process and a lithography process and an etching process are performed sequentially to form the hard mask patterns 210 on the top surface 201 of the substrate 200 to define the trenches 212 for forming the word line. In some embodiments, the hard mask patterns 210 extend along the direction D2 and are spaced apart along the direction D3, exposing portions of the substrate 200 and portions of the isolation features 206.

Next, an etching process (e.g., dry etching) is performed on the exposed substrate 200 and the isolation feature 206 to form the trenches 212 in the substrate 200 in the active region 208 and the isolation features 206 using the hard mask patterns 210 as etching masks. Since the etch rate of the substrate (such as silicon) and the isolation feature 206 (such as silicon oxide) are different, a depth H1 of a first portion 212-1 of the trench 212 in the isolation feature 206 is greater than a depth H2 of the second portion 212-2 of the trench 212 in active region 208. In some embodiments, in the direction D1, a width W1 of the trench 212 is less than a width W2 of the cut-off region 272 of the isolation feature 206.

Figure 6A:
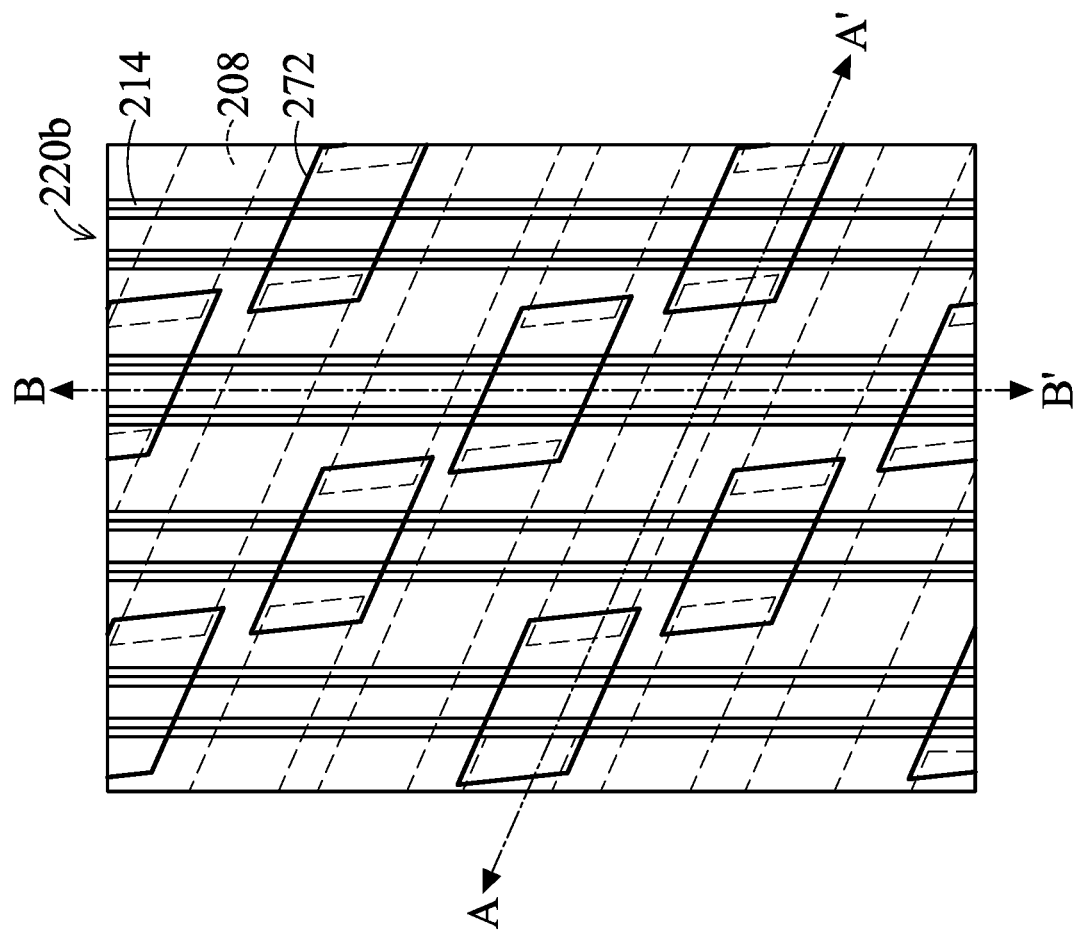

Next, as shown in FIGS. 6A, 6B, and 6C, multiple deposition processes are performed to conformally form the gate dielectric layer 214 in the trenches 212. Next, the liner 216 is conformally formed on the gate dielectric layer 214. Next, a gate electrode layer 218 is deposited, covering the gate dielectric layer 214 and the liner 216 and filling the trenches 212. Next, an etching back process (e.g., dry etching) is performed to remove a portion of the liner 216 and a portion of the gate electrode layer 218 on the substrate 200 and in the trench 212, so that the upper portion of the trench 212 is exposed again, so as to form the first conductive structure 220b in the lower portion of the trench 212. In some embodiments, the top surface 220-1T of the first portion 220-1 of the first conductive structure 220b in the isolation feature 206 is level with the top surface of the 220-2T of the second portion 220-2 of the first conductive structure 220b in the active region 208.

Figure 7A:
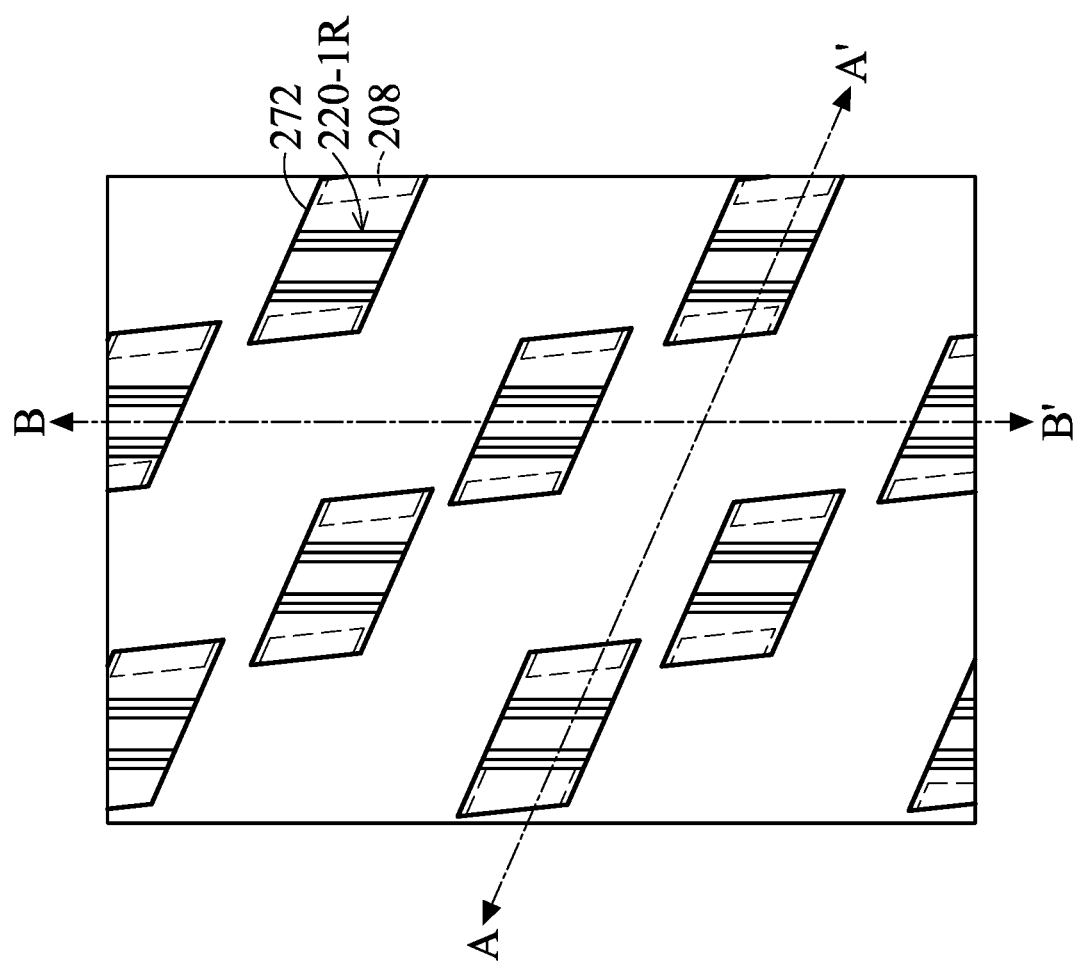
Figure 7B:
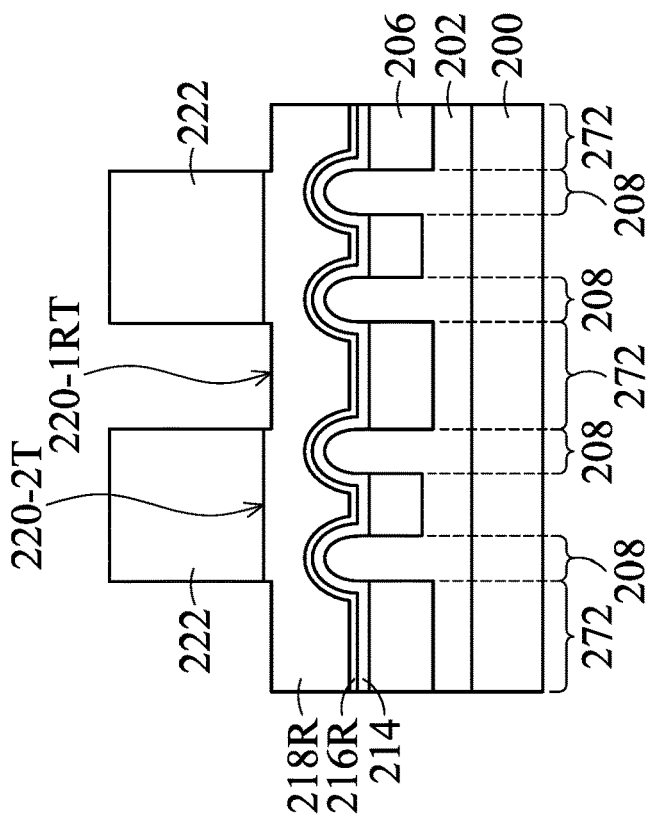
Figure 7C:
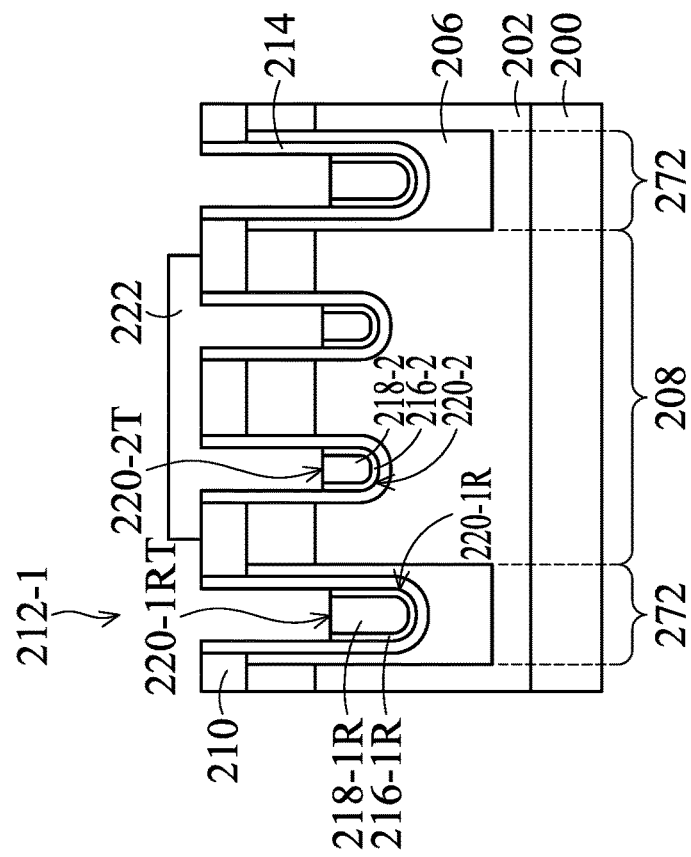

Next, as shown in FIGS. 7A, 7B, and 7C, a patterned mask 222 is formed to cover the trenches 212 in the active region 208 and exposes the first portion 212-1 of the trenches 212 in the isolation features 206 and the first portion 220-1 of the first conductive structure 220b within the first portion 212-1 of the trenches 212.

Next, another etching back process is performed to remove the first portion 212-1 (a portion of a liner 216-1 and a portion of a gate electrode layer 218-1) in the isolation feature 206 to form the first conductive structure 220a. After performing the etching back process, the first portion 220-1R of the first conductive structure 220a in the cut-off region 272 includes a liner 216-1R and a gate electrode layer 218-1R. The top surface 220-1RT of the first portion 220-1R of the first conductive structure 220a in the isolation feature 206 is located below the top surface 220-2T of the second portion 220-2 of the first conductive structure 220a in the active region 208 and below the bottom surface 204bB of the doped region 204b. As shown in FIG. 7C, the top surface 220aT of the first conductive structure 220a is jagged in the cross-sectional view along the direction D2. After forming the first conductive structure 220a, the patterned mask 222 is removed.

Figure 8A:
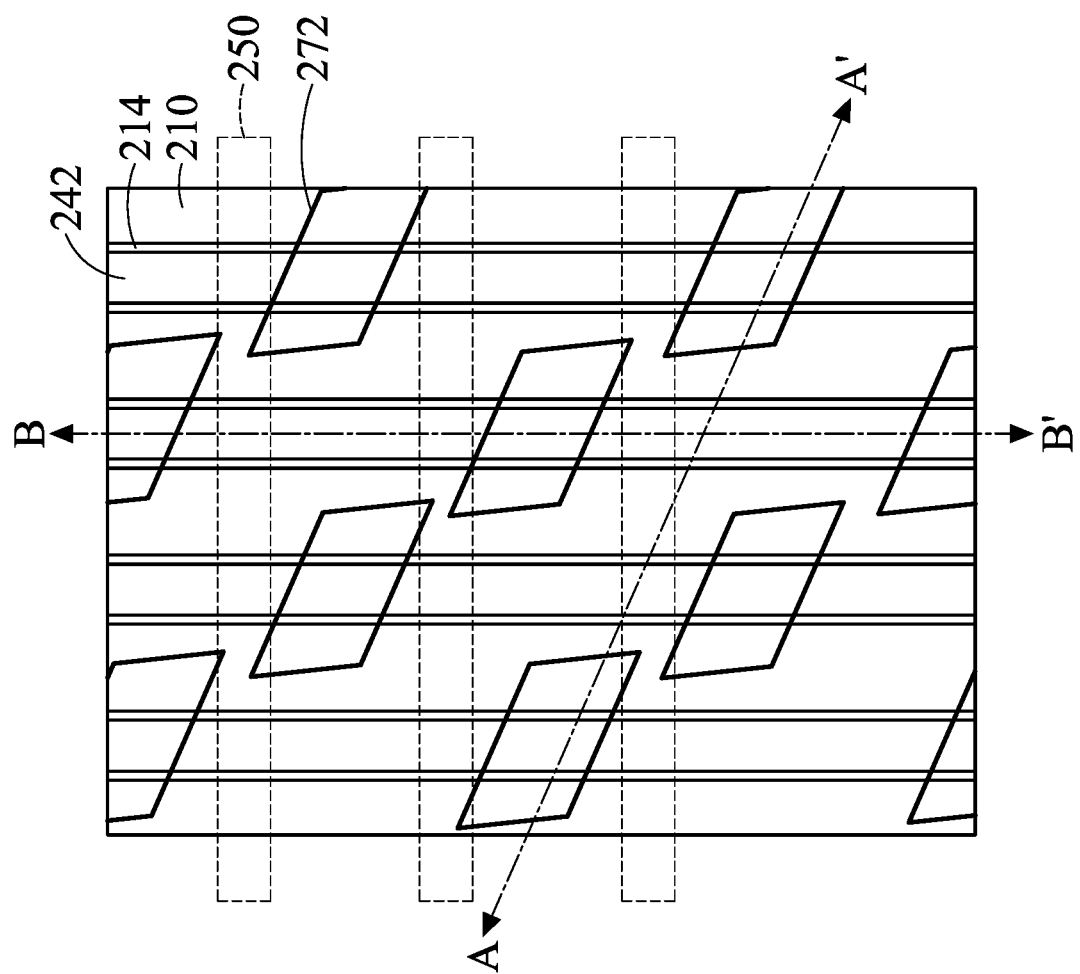
Figure 8C:
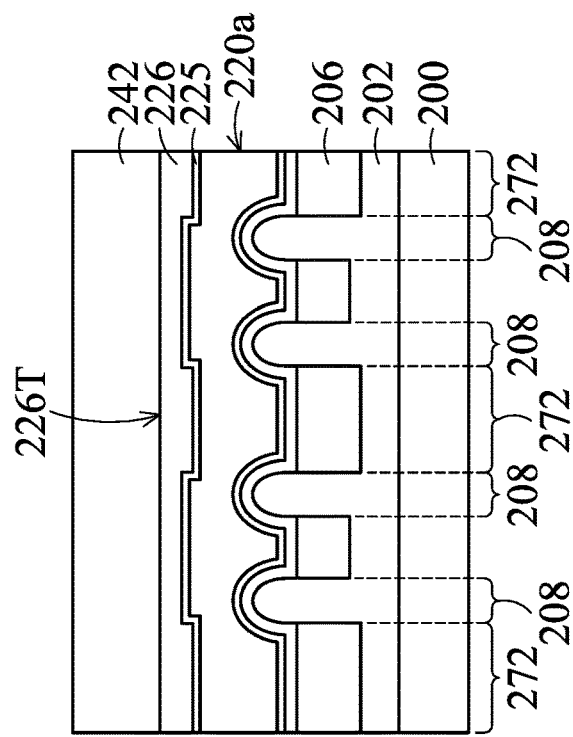
Figure 8B:
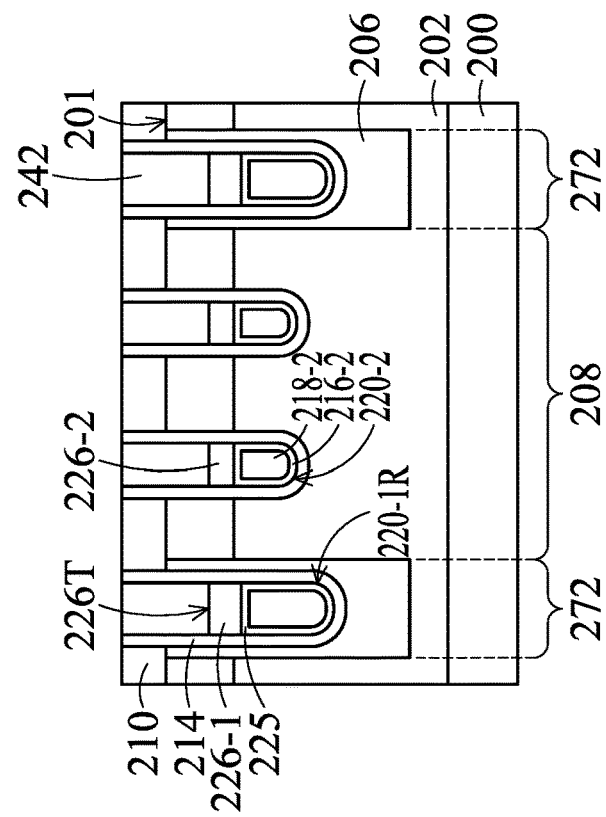

Next, as shown in FIGS. 8A, 8B, and 8C, a liner material (for example, the same material as the liner 216R) and a conductive material (not shown) are sequentially deposited to cover the first conductive structure 220a and fill the trench 212. Next, yet another etching back process is performed to remove a portion of the conductive material in the trench 212, so that the upper part of the trench 212 and a portion of the gate dielectric layer 214 are exposed to form the liner 225 and the second conductive structure 226. A top surface 226T of the second conductive structure 226 is below the top surface 201 of the substrate 100. As shown in FIG. 8C, the top surface 226T of the second conductive structure 226 is a planar surface in the cross-sectional view along the direction D2. In some embodiments, the first conductive structure 220a and the second conductive structure 226 are made of different materials and have different structures. After forming the second conductive structure 226, the word line 230a is formed in the substrate 200 extending across the active region 208 and the isolation feature 206 and adjacent to the doped region 204. In some embodiments, the steps shown in FIGS. 7A, 7B, and 7C may also be omitted, and the etching back process is not performed to form the height difference between the first portion 220-1 and the second portion 220-2 of the first conductive structure 220b, and the second conductive structure 226 is directly deposited on the first conductive structure 220b.

Next, a deposition process and a subsequent planarization process are performed to form the capping layer 242 on the word line 230a and fill the upper portion of the trench 212. The top surface of the capping layer 242 is level with the top surface of the hard mask pattern 210.

Next, as shown in FIGS. 1, 2A, and 2B, a deposition process is performed to form the capping layer 244 and the interlayer dielectric layer 246 over the substrate 200. Next, a patterning process, a deposition process, and a removal process are performed in sequence to form the contact plugs 248a, 248b in the openings (not shown) of the capping layer 244 and the interlayer dielectric layer 246.

Next, as shown in FIGS. 1, 2A, and 2B, a deposition process and subsequent removal process (including a planarization process (e.g., chemical mechanical polishing (CMP)), an etching back process, or a combination thereof) are performed to form the bit line 250, the storage capacitor 260, the sidewall layer 256 and the capping layer 258. After performing the aforementioned processes, the semiconductor structure 500a is formed. In addition, additional components, such as interconnect structures, peripheral circuits, or other suitable components, may be formed on the semiconductor structure 500a to fabricate a semiconductor memory device.

Referring to FIGS. 9A, 9B, 9C to 12A, 12B, and 12C, another method of forming the word line will be described, in which the reference numbers the same or similar to those in FIGS. 5A, 5B and 5C to 8A, 8B and 8C denote the same or similar elements.

Figure 9A:
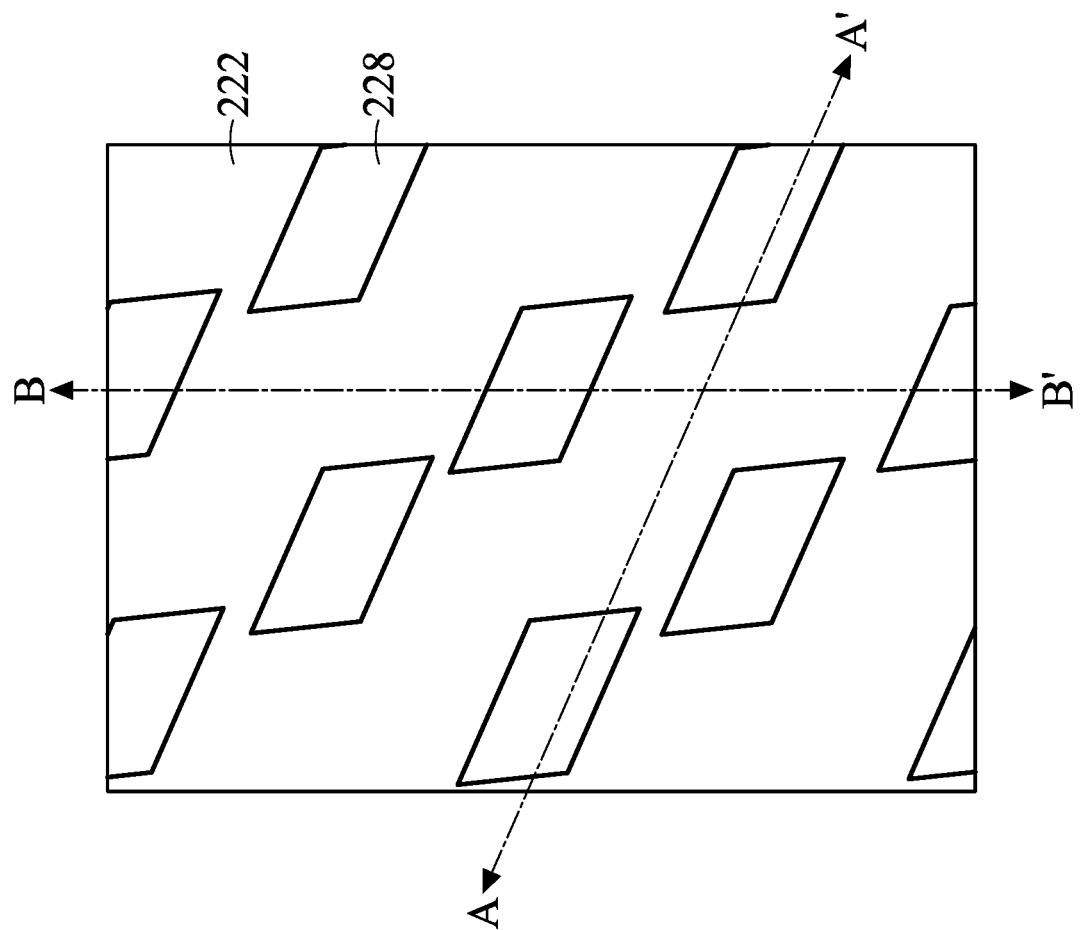
FIGS. 9A, 10A, 11A, and 12A are schematic top views of intermediate stages of forming a semiconductor structure in accordance with some embodiments of the disclosure.
Figure 9C:
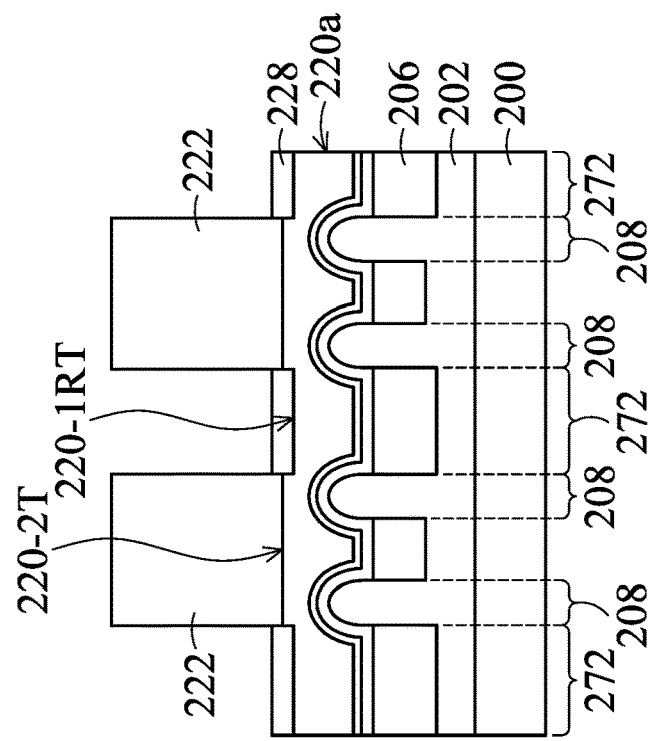
Figure 9B:
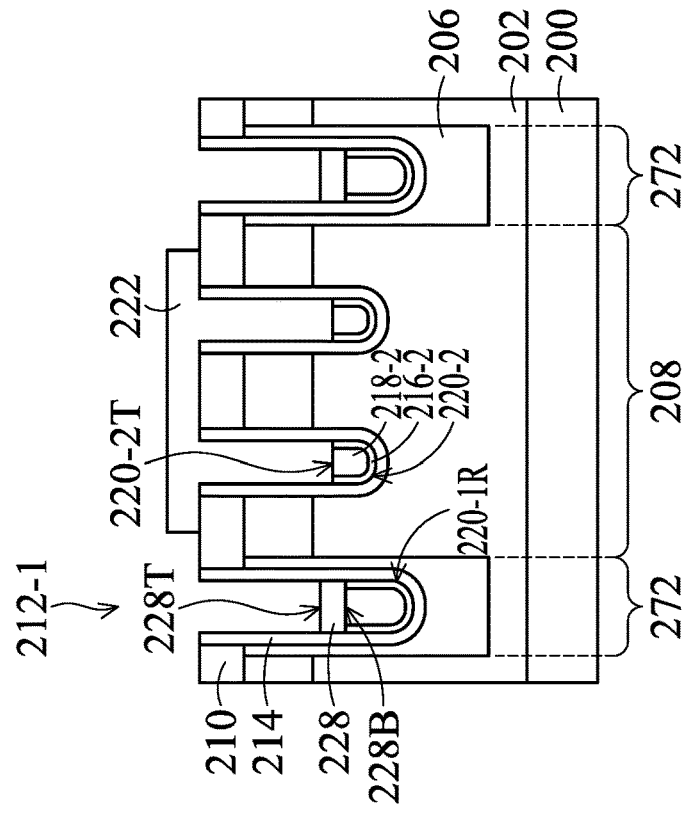

Please refer to FIGS. 9A, 9B, and 9C. After forming the first conductive structure 220a as shown in FIGS. 7A, 7B and 7C, a deposition process and a subsequent etching back process are performed to form the dielectric feature 228 on the first portion 220-1R of the first conductive structure 220a in the isolation feature 206 and fills a portion of the first portion 212-1 of the trench 212. In some embodiments, a dielectric material is deposited in the trench 212, and then an etching back process (e.g., wet etching) is used to remove excess dielectric material over the substrate 200 to form the dielectric feature 228 in the first portion 212-1 of the trench 212. Since the dielectric feature 228 (e.g., silicon nitride) can be selected from a material having the etch selectivity to the gate dielectric layer 214 (e.g., silicon oxide), the subsequent etching back processes (e.g., wet etching) will not damage the gate dielectric layer 214.

Figure 10A:
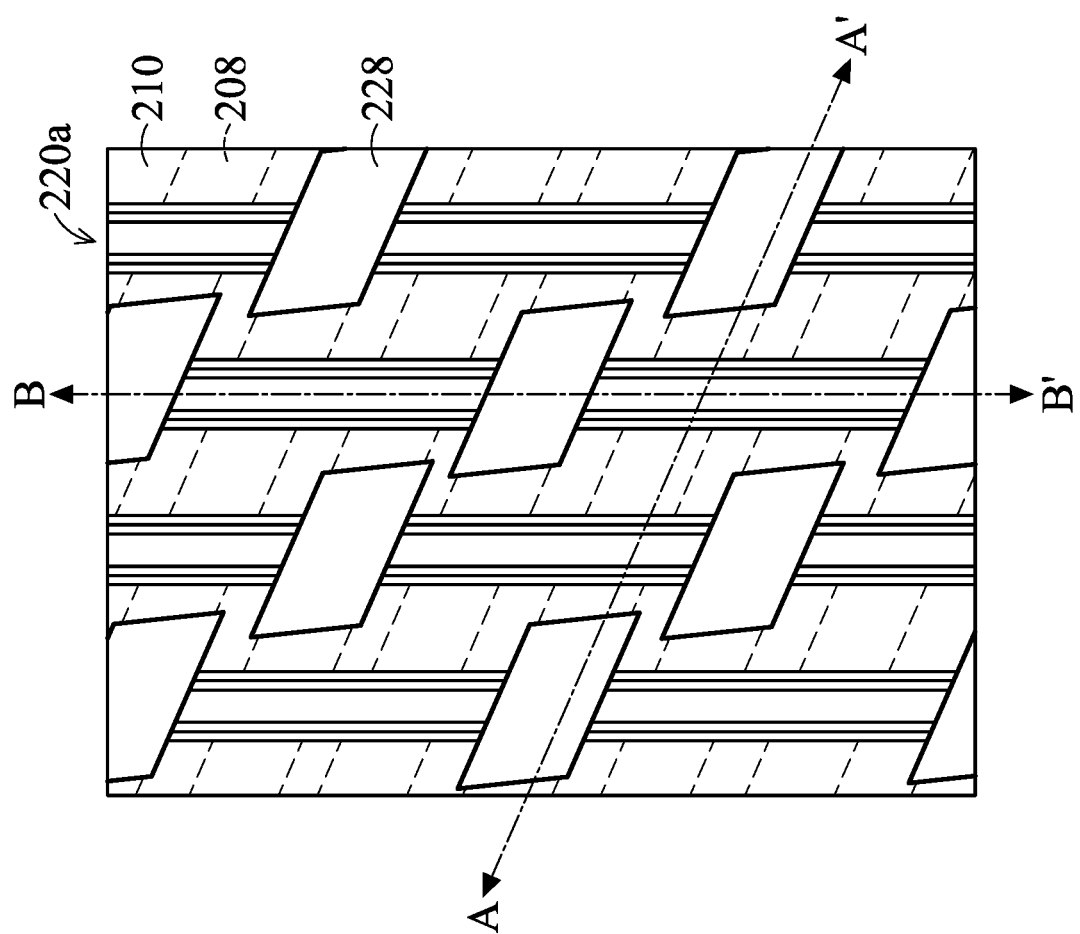
Figure 10C:
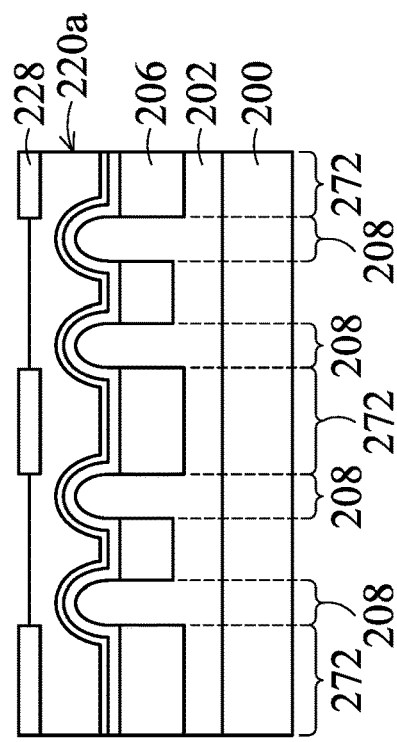
Figure 10B:
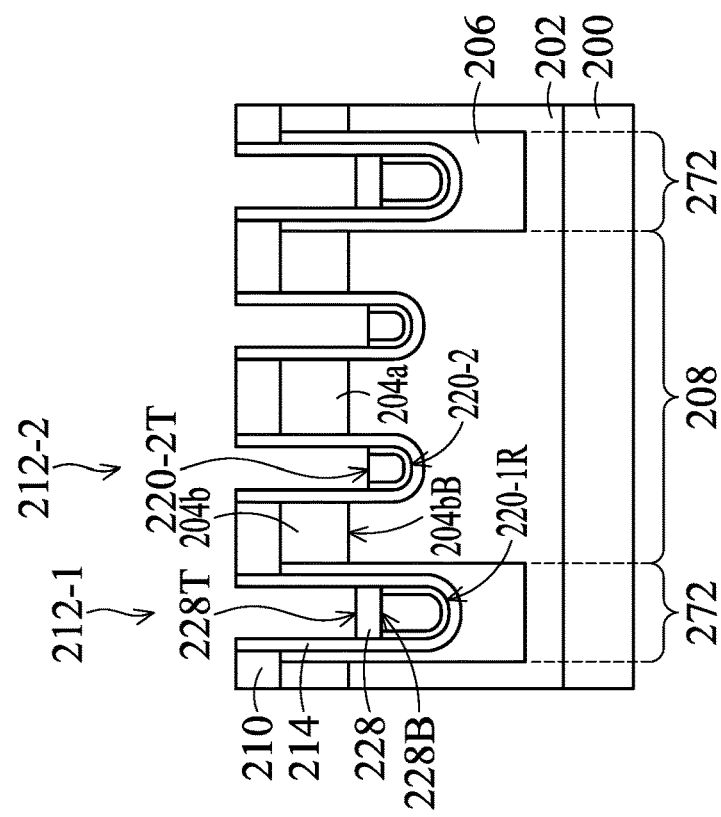

Next, as shown in FIGS. 10A, 10B, and 10C, a removal process (e.g., wet etching) is performed to remove the patterned mask 222 to expose the second portion 220-2 of the first conductive structure 220a in the active region 208.

Next, as shown in FIGS. 11A, 11B, and 11C, a deposition process is performed to conformally form the liner 236 in the trench 212 and cover the first conductive structure 220a and the dielectric feature 228. The liner 236 includes a liner 236-1 in the cut-off region 272 and a liner 236-2 in active region 208. The liner 236-1 is in contact with the dielectric feature 228. The liner 236-2 is in contact with the liner 216-2 and the gate electrode 218-2 of the second portion 220-2 of the first conductive structure 220a. Next, the gate electrode layer 238 (including a gate electrode layer 238-1 in the cut-off region 272 and a gate electrode layer 238-2 in the active region 208) is deposited in the trench 212, covering the gate dielectric layer 214 and the liner 236 and filling the trench 212. Next, an etching back process (e.g., dry etching) is performed to remove a portion of the liner 236 and a portion of the gate electrode layer 238 on the substrate 200 and in the trench 212, so that the upper portion of the trench 212 is exposed again, so as to form the second conductive structure 240 in the trench 212. In some embodiments, the liner 236 may also not be formed. In some embodiments, a top surface 240T of the second conductive structure 240 is below the top surface 201 of the substrate 200. A top surface 240-1T of the first portion 240-1 of the second conductive structure 240 in the cut-off region 272 is level with a top surface 240-2T of the second portion 240-2 in the active region 208. As shown in FIG. 11C, the top surface 240T (including the top surfaces 240-1T and 240-2T) of the second conductive structure 240 is a planar surface in the cross-sectional view along the direction D2. After formation of the second conductive structure 240, the word line 230b is formed in the substrate 200 extending across the active region 208 and the isolation feature 206 and adjacent to the doped region 204.

Figure 12A:
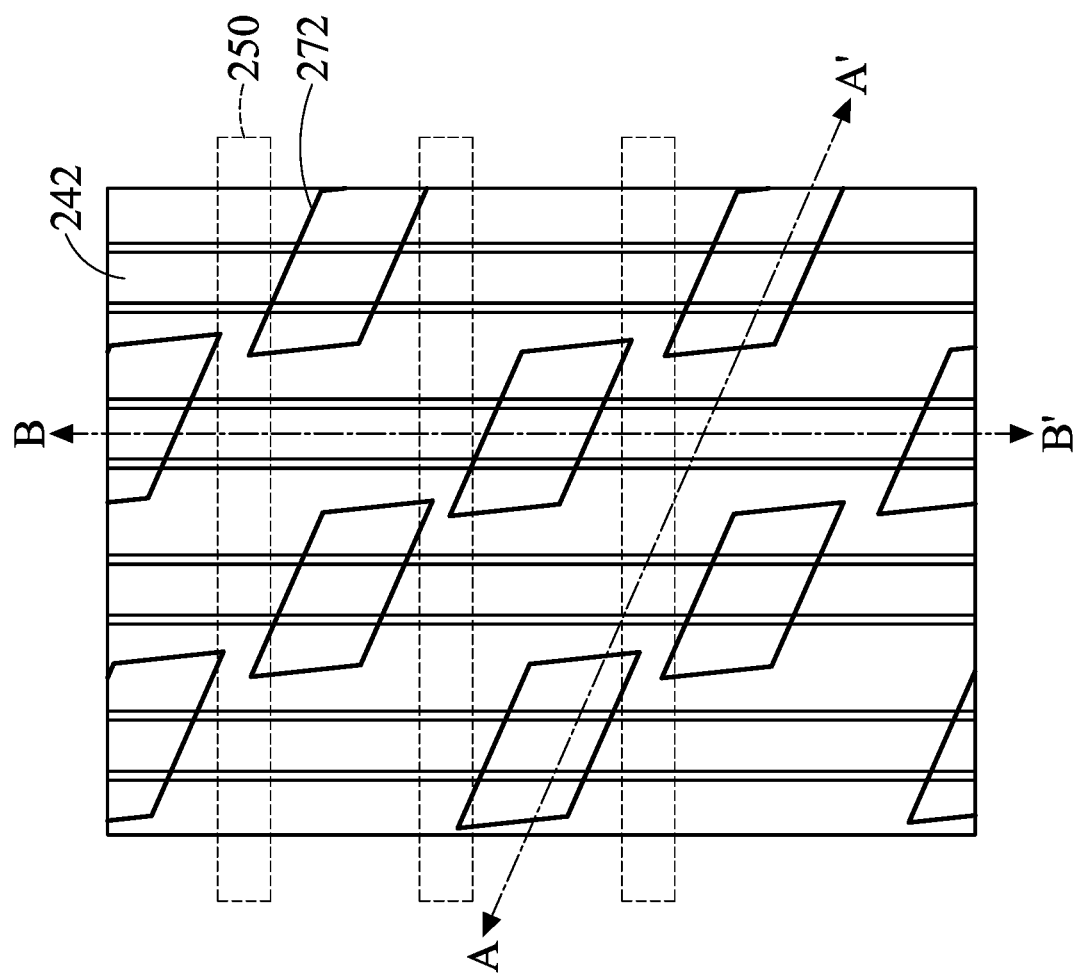
Figures 12B, 12C:
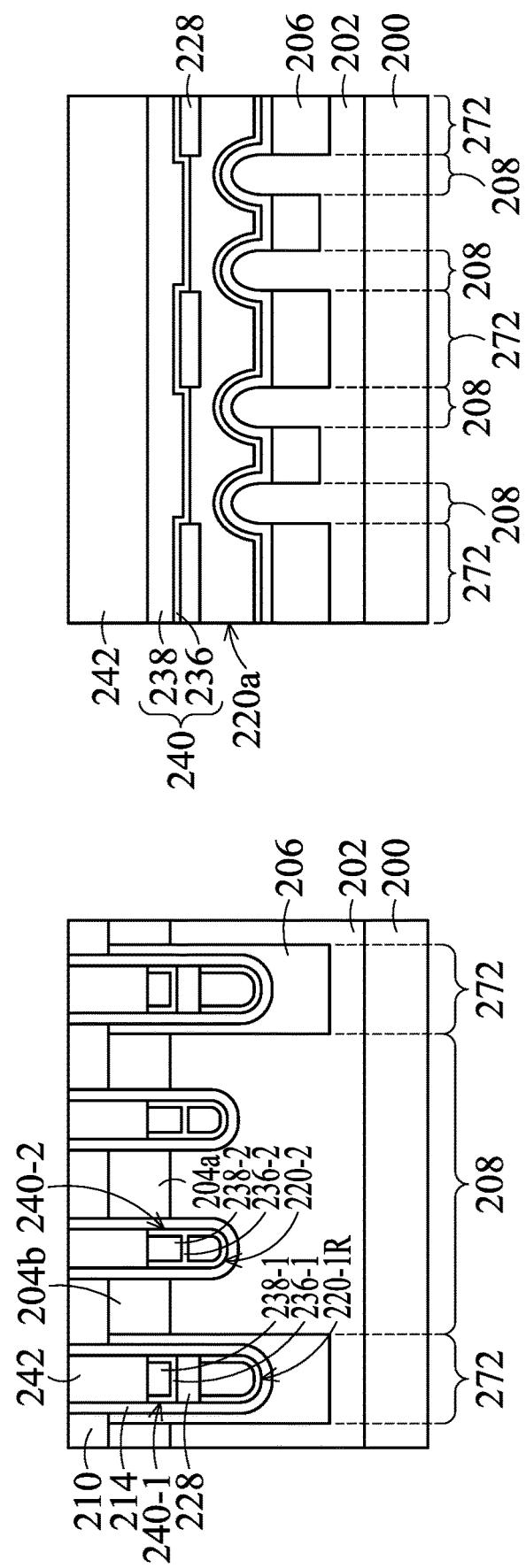

Next, as shown in FIGS. 12A, 12B, and 12C, the deposition process and the subsequent etching back process as shown in FIGS. 8A, 8B, and 8C are performed to form the capping layer 242 on the word line 230b, and fills the upper portion of trench 212 (FIG. 7B). The top surface of the capping layer 242 is level with the top surface of the hard mask pattern 210.

Next, as shown in FIGS. 1, 3A, and 3B, the processes shown in FIGS. 1, 2A and 2B are performed to form the capping layer 244 and the interlayer dielectric layer 246 over the substrate 200, and form the contact plugs 248a and 248b, the bit line 250 and the storage capacitor 260 on the doped region 204 and in the capping layer 244 and the interlayer dielectric layer 246. In addition, the sidewall layer 256 and the capping layers 258 are formed on the sidewalls and the top surfaces of bit line 250. After performing the aforementioned processes, the semiconductor structure 500b is formed. In addition, additional components, such as interconnect structures, peripheral circuits, or other suitable components, may be formed on the semiconductor structure 500b to fabricate a semiconductor memory device.

Referring to FIGS. 13A, 13B, 13C to 14A, 14B, and 14C, another method of forming word lines will be described, in which the reference numbers the same or similar to those in FIGS. 5A, 5B and 5C to 12A, 12B and 12C denote the same or similar elements.

Figure 13A:
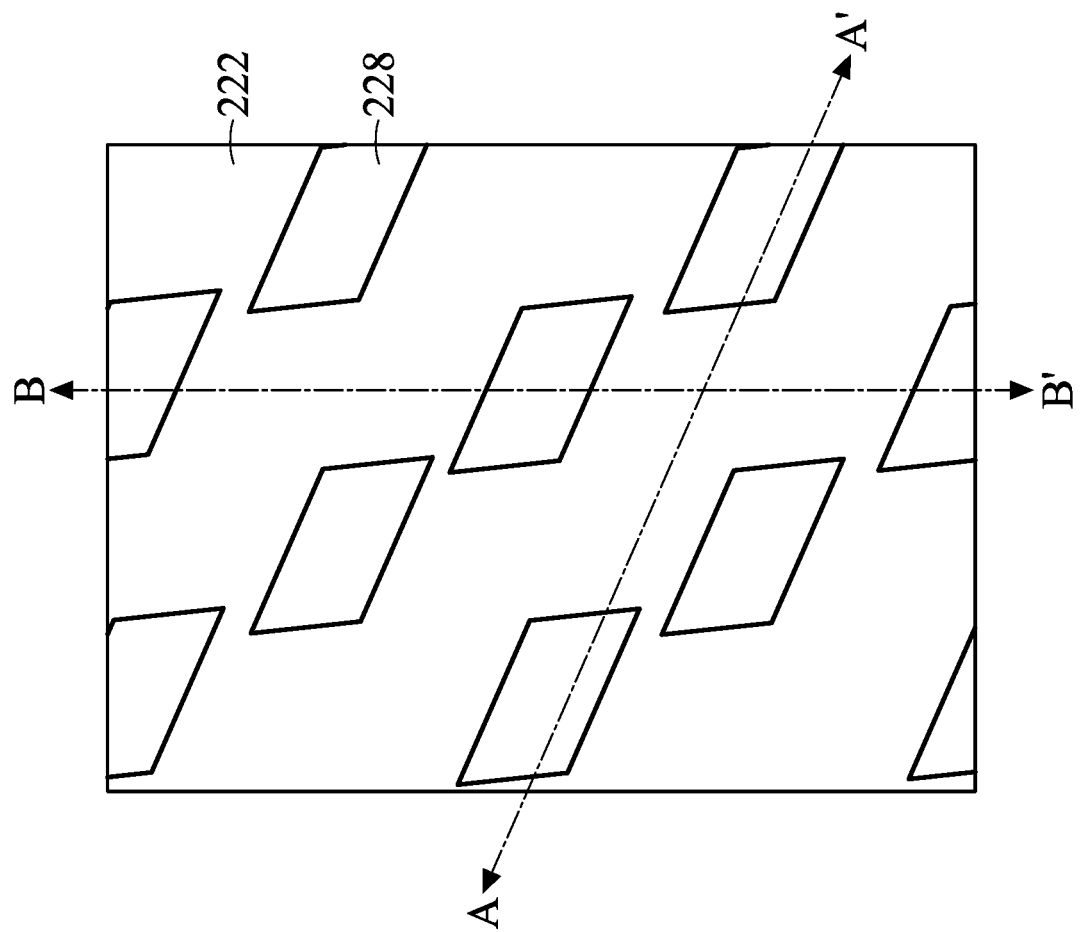
FIGS. 13A and 14A are schematic top views of intermediate stages of forming a semiconductor structure in accordance with some embodiments of the disclosure.
Figures 13B, 13C:
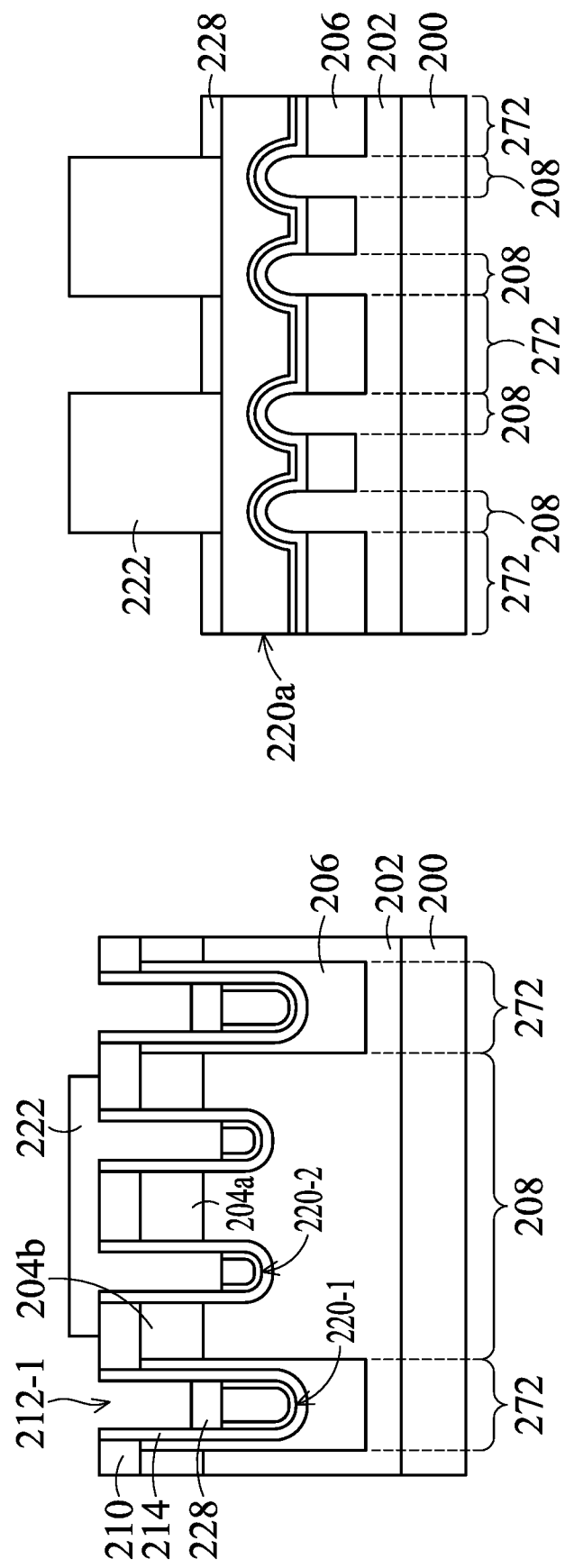
FIGS. 13B and 14B are schematic cross-sectional views taken along line A-A' of FIGS. 13A and 14A, respectively, showing schematic cross-sectional views of intermediate stages of forming a semiconductor structure in accordance with some embodiments of the disclosure.
FIGS. 13C and 14C are schematic cross-sectional views taken along line B-B' of FIGS. 13A and 14A, respectively, showing schematic cross-sectional views of intermediate stages of forming a semiconductor structure in accordance with some embodiments of the disclosure.

Please refer to FIGS. 13A, 13B, and 13C. After forming the first conductive structure 220b as shown in FIGS. 6A, 6B, and 6C, the processes shown in FIGS. 9A, 9B, and 9C are performed to form the dielectric feature 228 on the first portion 220-1 of the first conductive structure 220b in the isolation feature 206 and fills a portion of the first portion 212-1 of the trench 212. Next, the processes shown in FIGS. 10A, 10B, and 10C are performed to remove the patterned mask 222 to expose the second portion 220-2 of the first conductive structure 220b in the active region 208.

Figure 14A:
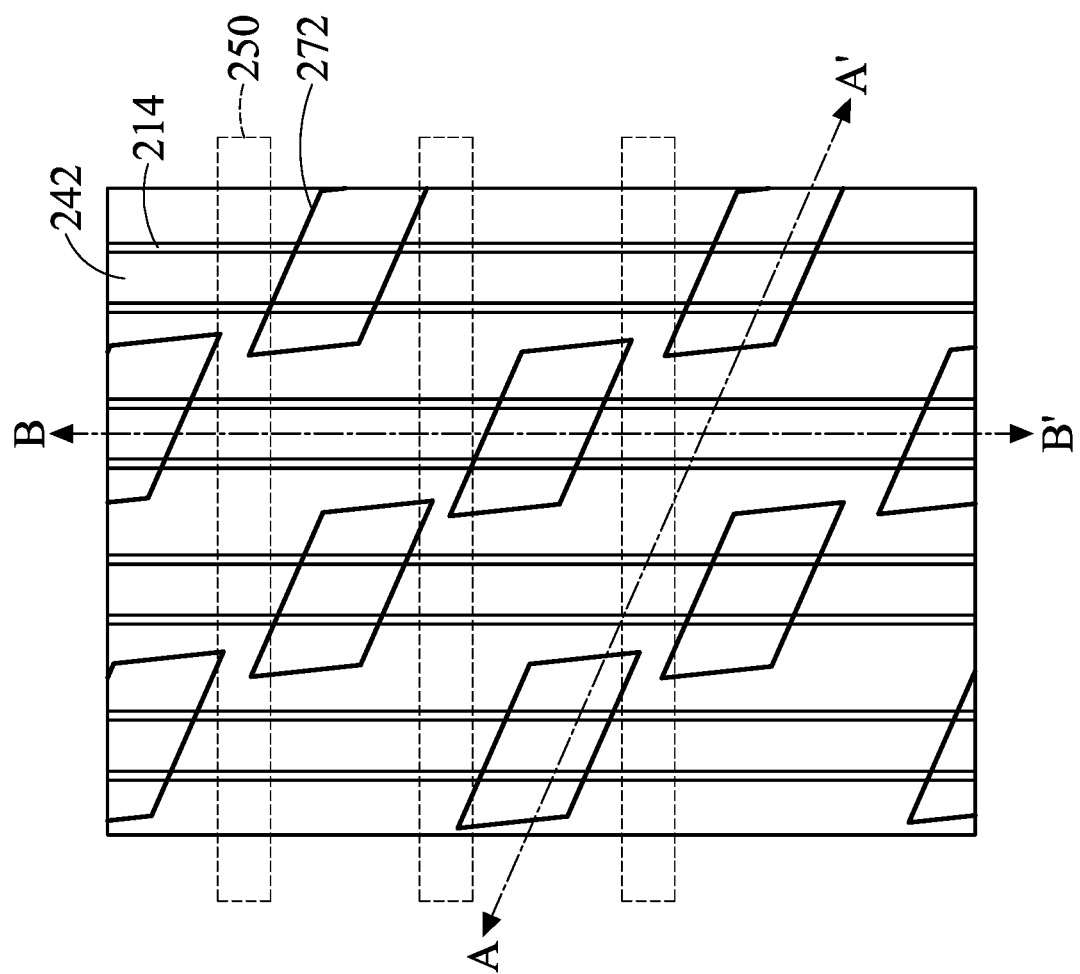
Figure 14B:
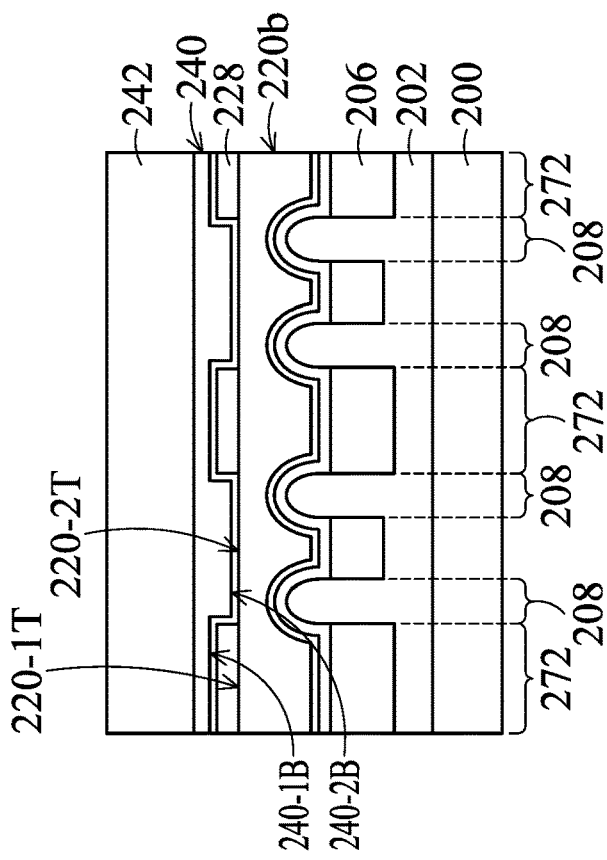
Figure 14C:
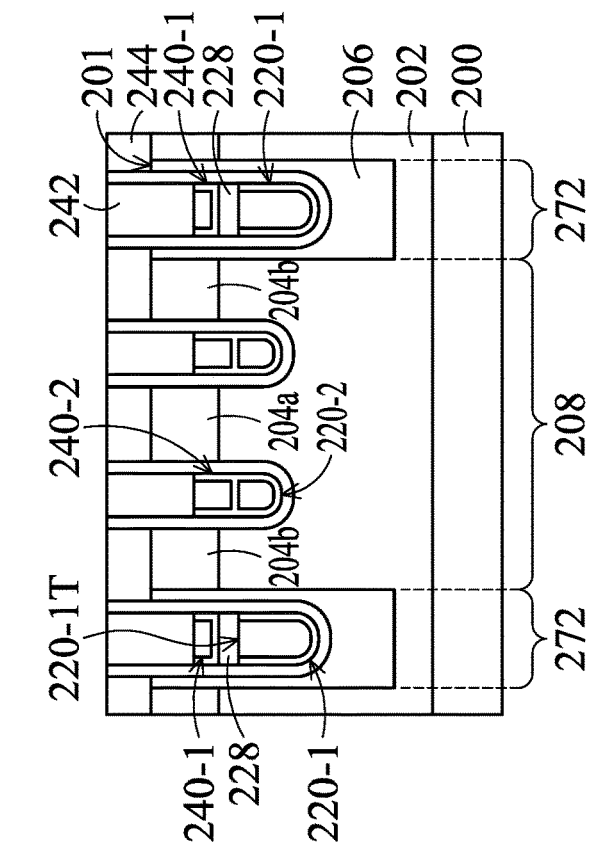

Next, as shown in FIGS. 14A, 14B, and 14C, the processes shown in FIGS. 11A, 11B, and 11C are performed to form the second conductive structure 240 covering the first conductive structure 220b in the trench 212. After the formation of the second conductive structure 240, the word line 230b is formed in the substrate 200 and extending across the active region 208 and the isolation feature 206 and adjacent to the doped region 204.

Next, the deposition process and the subsequent etching back process as shown in FIGS. 8A, 8B, and 8C are performed to form the capping layer 242 on the word line 230b and fill the upper portion of the trench 212 (FIG. 7B). The top surface of the capping layer 242 is level with the top surfaces of the hard mask patterns 210.

Next, as shown in FIGS. 1, 4A, and 4B, the processes shown in FIGS. 1, 2A, and 2B are performed to form the capping layer 244 and the interlayer dielectric layer 246 over the substrate 200, and form the contact plugs 248a and 248b, the bit line 250 and the storage capacitor 260 on the doped region 204 and in the capping layer 244 and the interlayer dielectric layer 246. In addition, the sidewall layer 256 and the capping layers 258 are formed on the sidewalls and the top surfaces of bit line 250. After performing the aforementioned processes, the semiconductor structure 500c is formed. In addition, additional components, such as interconnect structures, peripheral circuits, or other suitable components, may be formed on the semiconductor structure 500c to fabricate a semiconductor memory device.

Embodiments provide a semiconductor structure and a method of forming the same. In some embodiments, the top surface of the first conductive structure in the cut-off region of the isolation feature is below the bottom surface of the doped region of the adjacent word line. In some embodiments, the work function of the second conductive structure of the word line is less than the work function of the first conductive structure to reduce the electric field in the overlapping region of the second conductive structure and the doped region, so that the GIDL and the channel leakage and the junction leakage from doping region to the underlying substrate can be reduced. In some embodiments, the semiconductor structure includes the dielectric feature disposed in the cut-off region of the isolation feature and between the first conductive structure and the second conductive structure. When the applied voltage levels are switched on adjacent word lines, the dielectric feature can cut off the channel region and the depletion region formed along the vertical sidewalls of the isolation feature between the passing word line and the adjacent doped region by reversed biasing the carriers. Therefore, the channel leakage and junction leakage generated from the drain doped region to the underlying semiconductor substrate can be suppressed. The dielectric feature can also reduce the electric field in the overlapping region of the first conductive structure and the drain doped region, thereby reducing the GIDL and maintaining the writing/reading speed of the word line. Therefore, the row hammer effect can be improved, the refresh time performance can be improved, and the reliability of the semiconductor structure element can be increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure comprising:
   a substrate having an active region;
   an isolation feature disposed in the substrate to define the active region;
   a word line buried in the substrate and extending across the active region and the isolation feature, wherein the word line comprises:
   a first conductive structure; and
   a second conductive structure disposed on the first conductive structure;
   a doped region disposed in the active region and adjacent to the word line, wherein a top surface of the first conductive structure is below a bottom surface of the doped region; and
   a dielectric feature disposed in the isolation feature and located between the first conductive structure and the second conductive structure.

2. The semiconductor structure as claimed in claim 1, wherein a bottom surface of the second conductive structure is jagged in a cross-sectional view along a word line extending direction.

3. The semiconductor structure as claimed in claim 1, wherein a first top surface of the first conductive structure in the isolation feature is below the bottom surface of the doped region, and the first top surface of the first conductive structure is below a second top surface of a conductive structure in the active region.

4. The semiconductor structure as claimed in claim 1, wherein the top surface of the first conductive structure is jagged in a cross-sectional view along a word line extending direction.

5. The semiconductor structure as claimed in claim 1, wherein a first bottom surface of the second conductive structure in the isolation feature is below a second bottom surface of the second conductive structure in the active region.

6. The semiconductor structure as claimed in claim 1, wherein the first conductive structure and the second conductive structure are made of the same material.

7. The semiconductor structure as claimed in claim 6, wherein the first conductive structure and the second conductive structure respectively comprise:
   a liner conformally covering a trench in the substrate; and
   a gate electrode layer disposed on the liner and partially filling the trench.

8. The semiconductor structure as claimed in claim 7, wherein the liner of the second conductive structure in the active region is in contact with the liner and the gate electrode layer of the first conductive structure in the active region.

9. The semiconductor structure as claimed in claim 6, wherein a top surface of the dielectric feature is above the bottom surface of the doped region.

10. The semiconductor structure as claimed in claim 6, wherein a bottom surface of the dielectric feature is below the bottom surface of the doped region.

11. The semiconductor structure as claimed in claim 6, wherein a first top surface of the first conductive structure in the isolation feature is level with a second top surface of the first conductive structure in the active region.

12. A method for forming a semiconductor structure, comprising:
   providing a substrate;
   forming a doped region in the substrate;

forming an isolation feature in the substrate to define an active region; forming a word line in the substrate, extending across the active region and the isolation feature and adjacent to the doped region, wherein the word line comprises:
a first conductive structure; and
a second conductive structure disposed on the first conductive structure, wherein a top surface of the first conductive structure is below a bottom surface of the doped region; and
forming a dielectric feature disposed in the isolation feature and located between the first conductive structure and the second conductive structure.

13. The method for forming a semiconductor structure as claimed in claim 12, further comprising:
forming a trench in the substrate;
forming a gate dielectric layer in the trench, wherein the trench is formed for the word line forming therein;
forming a first liner on the gate dielectric layer; and
depositing a first gate electrode layer, covering the gate dielectric layer and the first liner and filling the trench to form the first conductive structure, wherein a first top surface of the first conductive structure in the isolation feature is level with a second top surface of the first conductive structure in the active region.

14. The method for forming a semiconductor structure as claimed in claim 13, further comprising:
forming a patterned mask covering the trench in the active region to expose the trench in the isolation feature after forming the first conductive structure; and removing a portion of the first liner and a portion of the first gate electrode layer in the trench in the isolation feature to form the etched-back first conductive structure.

15. The method for forming a semiconductor structure as claimed in claim 13, further comprising:
depositing a conductive material to cover the first conductive structure and filling the trench to form the second conductive structure, wherein a top surface of the second conductive structure is a planar surface in a cross-sectional view along a word line extending direction.

16. The method for forming a semiconductor structure as claimed in claim 13, further comprising:
forming a capping layer on the word line and filling the trench, wherein the trench divides the doped region in the active region into a source doped region and a drain doped region on opposite sides of the word line; and
forming a bit line on the doped region, wherein the bit line is electrically connected to a source doped region of the active region.

17. The method for forming a semiconductor structure as claimed in claim 12, further comprising:
depositing a second liner in the trench covering the first conductive structure and the dielectric feature;
depositing a second gate electrode layer covering the second liner and filling the trench; and
removing the second liner and the second gate electrode layer in the trench to form the second conductive structure.

* * * * *